United States Patent
Lin et al.

(10) Patent No.: US 10,446,522 B2
(45) Date of Patent: Oct. 15, 2019

(54) METHODS OF FORMING MULTIPLE CONDUCTIVE FEATURES IN SEMICONDUCTOR DEVICES IN A SAME FORMATION PROCESS

(71) Applicant: Taiwan Semiconductor Manufacturing Company, Ltd., Hsin-Chu (TW)

(72) Inventors: Meng-Liang Lin, Hsin-Chu (TW); Cheng-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/688,883

(22) Filed: Apr. 16, 2015

(65) Prior Publication Data

US 2016/0307862 A1    Oct. 20, 2016

(51) Int. Cl.
*H01L 25/065* (2006.01)
*H01L 21/56* (2006.01)
(Continued)

(52) U.S. Cl.
CPC .... *H01L 25/0657* (2013.01); *H01L 21/76885* (2013.01); *H01L 24/19* (2013.01);
(Continued)

(58) Field of Classification Search
CPC ....... H01L 24/14; H01L 23/481; H01L 24/11; H01L 21/56; H01L 23/3171;
(Continued)

(56) References Cited

U.S. PATENT DOCUMENTS 8,952,544 B2   2/2015   Lin et al.
2002/0076908 A1   6/2002   Makino et al.
(Continued)

FOREIGN PATENT DOCUMENTS

CN    104282649 A    1/2015
JP    2008211078 A   9/2008
(Continued)

OTHER PUBLICATIONS

F.B. Kaufman, Chemical-Mechanical Polishing for Fabricating Patterned W Metal Features as Chip Interconnects, J. Electrochem. Soc., vol. 138, No. 11, pp. 3460-3464, Nov. 1991.*
(Continued)

*Primary Examiner* — Nelson Garces
(74) *Attorney, Agent, or Firm* — Slater Matsil, LLP

(57) ABSTRACT

Semiconductor devices and methods of forming the same are described. An embodiment is a device including a pad on a substrate. A passivation film is on the substrate and covering at least a portion of the pad. A first conductive feature is on the pad and has a planar top surface, with the first conductive feature having a first height as measured from the pad to the planar top surface of the first conductive feature. A second conductive feature is on the passivation film and has a non-planar top surface, with the second conductive feature having a second height as measured from the passivation film to the non-planar top surface of the second conductive feature.

20 Claims, 26 Drawing Sheets

(51) Int. Cl.
| | |
|---|---|
| *H01L 21/768* | (2006.01) |
| *H01L 23/31* | (2006.01) |
| *H01L 23/00* | (2006.01) |
| *H01L 25/10* | (2006.01) |
| *H01L 25/00* | (2006.01) |
| *H01L 21/288* | (2006.01) |
| *H01L 23/525* | (2006.01) |

(52) U.S. Cl.
CPC .............. *H01L 24/20* (2013.01); *H01L 24/97* (2013.01); *H01L 25/105* (2013.01); *H01L 25/50* (2013.01); *H01L 21/2885* (2013.01); *H01L 21/561* (2013.01); *H01L 21/568* (2013.01); *H01L 23/3128* (2013.01); *H01L 23/525* (2013.01); *H01L 2224/0401* (2013.01); *H01L 2224/11462* (2013.01); *H01L 2224/12105* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/19* (2013.01); *H01L 2224/32145* (2013.01); *H01L 2224/32225* (2013.01); *H01L 2224/48091* (2013.01); *H01L 2224/73265* (2013.01); *H01L 2224/73267* (2013.01); *H01L 2224/92244* (2013.01); *H01L 2224/96* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/14* (2013.01); *H01L 2924/181* (2013.01)

(58) Field of Classification Search
CPC ................. H01L 23/3135; H01L 24/05; H01L 2224/14505; H01L 2224/13164; H01L 2224/13021; H01L 2224/16146; H01L 21/76885; H01L 2225/06513; H01L 2225/06548; H01L 2924/181; H01L 2224/73265; H01L 2224/11462; H01L 2924/14; H01L 25/0657; H01L 25/105; H01L 25/50; H01L 24/97; H01L 24/19; H01L 24/20; H01L 2225/1041; H01L 2225/1058; H01L 2225/06568; H01L 2224/73267; H01L 2224/92244; H01L 2224/97; H01L 2224/48091; H01L 2224/32225; H01L 2224/32145; H01L 2225/0651; H01L 2225/1035; H01L 2224/19; H01L 23/525; H01L 21/2885; H01L 2224/96; H01L 2224/12105; H01L 21/568; H01L 23/3128; H01L 21/561; H01L 2224/13147; H01L 2224/0401; H01L 2224/13124; H01L 2224/13144; H01L 2224/13139; H01L 2224/13111; H01L 2224/13155; H01L 21/7685–76852; H01L 21/76865
USPC .................. 257/671–681, 732–742
See application file for complete search history.

(56) References Cited

U.S. PATENT DOCUMENTS

| | | |
|---|---|---|
| 2003/0080431 A1 | 5/2003 | Uzoh et al. |
| 2007/0164457 A1 | 7/2007 | Yamaguchi et al. |
| 2008/0308939 A1* | 12/2008 | Matsunaga ....... H01L 21/76801 257/758 |
| 2009/0166849 A1* | 7/2009 | Jao ...................... H01L 23/3128 257/700 |
| 2009/0229861 A1 | 9/2009 | Hando et al. |
| 2012/0012985 A1* | 1/2012 | Shen ................... H01L 23/3171 257/618 |
| 2012/0208129 A1* | 8/2012 | Kuo ........................ H01L 24/11 430/312 |
| 2012/0286418 A1* | 11/2012 | Lee ....................... H01L 21/563 257/737 |
| 2012/0313236 A1* | 12/2012 | Wakiyama ............ H01L 23/544 257/734 |
| 2013/0069234 A1* | 3/2013 | Lee ................... H01L 23/53238 257/751 |
| 2014/0061897 A1 | 3/2014 | Lin et al. |
| 2015/0008587 A1* | 1/2015 | Lin ....................... H01L 21/486 257/774 |
| 2015/0069623 A1 | 3/2015 | Tsai et al. |
| 2015/0137374 A1* | 5/2015 | Chen ................. H01L 23/53238 257/751 |

FOREIGN PATENT DOCUMENTS

| | | |
|---|---|---|
| KR | 1020090099481 A | 9/2009 |
| KR | 1020140029101 A | 3/2014 |
| KR | 1020150030134 A | 3/2015 |
| TW | 201409588 A | 3/2014 |

OTHER PUBLICATIONS

Chiu, S.-Y., et al., "Characterization of Additive Systems for Damascene Cu Electroplating by the Superfilling Profile Monitor," Journal of Vacuum Science & Technology, 2000, vol. B 18, Issue 2835, Science & Technology of Materials, Interfaces, and Processing.

Landau, U., et al., "Simulations of 'Bottom-Up' Fill in Via Plating of Semiconductor Interconnects," Department of Chemical Engineering, Matallization Symposium, Nov. 17-18, 2003, 14 pages.

Luo, J.K., et al., "Uniformity Control of Ni Thin-Film Microstructures Deposited by Through-Mask Plating," Journal of the Electrochemical Society, 2005, vol. 152, Issue 1, pp. C36-C41.

Moffat, T.P., et al., "Superconformal Electrodeposition of Copper in 500-90 nm Features," Journal of the Electrochemical Society, Aug. 9, 2000, pp. 4524-4535, vol. 147 Issue 12.

Moffat, T.P., et al., "Superconformal Electrodeposition of Copper," Electrochemical and Solid-State Letters, Feb. 26, 2001, vol. 4, Issue 4.

Park, T., et al., "Chip-Scale Modeling of Electroplated Copper Surface Profiles," Journal of the Electrochemical Society, 2004, vol. 151, Issue 6, pp. C418-C430.

Wheeler, D., et al., "Numerical Simulation of Superconformal Electrodeposition Using the Level Set Method," Proceedings of the International Conference on Modeling and Simulation of Microsystems, 2002, 4 pages.

* cited by examiner

METHODS OF FORMING MULTIPLE CONDUCTIVE FEATURES IN SEMICONDUCTOR DEVICES IN A SAME FORMATION PROCESS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
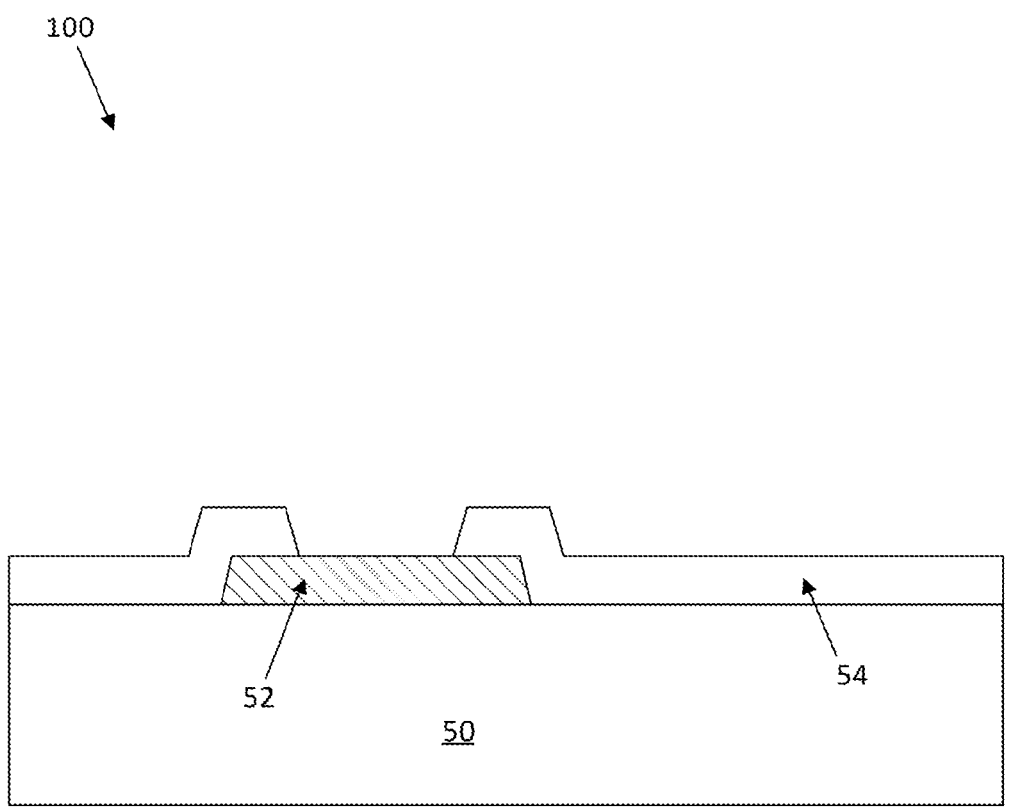
FIGS. 1 through 9 are cross sectional views of intermediate steps during a process for forming semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a semiconductor device that may be a component in a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

Before addressing the illustrated embodiments specifically, certain advantageous features and aspects of the present disclosed embodiments will be addressed generally. In general terms, the present disclosure is a semiconductor device and method of forming the same to increase the wafer throughput, reduce the processing costs, improve the gap-filling of dielectric material, and reduce the stress and warpage on the wafer. In particular, embodiments such as those disclosed below increase the wafer throughput and reduce the processing costs by minimizing the number of processing steps required to form an interconnect structure for the semiconductor device. This reduction in the number of processing steps is achieved by controlling the electroplating process to have different plating rates for different conductive feature sizes which can provide a feature height differentiation for conductive features that are formed in the same plating step.

For example, in some embodiments, the larger conductive features have a faster plating rate and will plate to a greater height (thickness) than a smaller conductive feature during the same plating process. This allows for the larger conductive features to, for example, act as vias to the next level of the interconnect structure, while the smaller features can be conductive lines/structures within the current interconnect level. In this example, the conductive vias and the conductive lines are both formed in the same process at the same time, and thus, do not require extra patterning and passivation layer formation steps. The simplified formation and profile of the vias and lines allows for improved gap-filling ability of the dielectric material surrounding those features.

Further, the reduction in the stress and warpage on the wafer is due to the minimization of passivation layer formation steps because many of the passivation layers require curing steps, which can cause stress and warpage on the wafer.

FIGS. 1 through 9 illustrate cross sectional views of intermediate steps during a process for forming a die 100 in accordance with some embodiments. FIG. 1 illustrates the die 100 at an intermediate stage of processing including a substrate 50, a pad 52, and a passivation film 54. Before the step illustrated in FIG. 1, the die 100 may be processed according to applicable manufacturing processes to form an integrated circuit in the die 100 to form an integrated circuit die 100. The substrate 50 may include a bulk semiconductor substrate, a semiconductor-on-insulator (SOI) substrate, multi-layered or gradient substrates, or the like. The semiconductor of the substrate 50 may include any semiconductor material, such as elemental semiconductor like silicon, germanium, or the like; a compound or alloy semiconductor including SiC, GaAs, GaP, InP, InAs, indium antimonide, SiGe, GaAsP, AlinAs, AlGaAs, GaInAs, GaInP, and/or GaInAsP; the like; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the die 100. The integrated circuit devices may be formed using any suitable methods.

The substrate 50 may also include an interconnect structure (not shown). The interconnect structure may be formed over the integrated circuit devices and are designed to connect the various integrated circuit devices to form functional circuitry. The interconnect structure may be formed of alternating layers of dielectric (e.g., low-k dielectric material) and conductive material (e.g., copper) and may be formed through any suitable process (such as deposition, damascene, dual damascene, etc.). The conductive and dielectric layers may include metal lines and vias (not shown) to electrically couple the integrated circuit devices to the pads 52. Only a portion of the substrate 50 is illustrated in the figures, as this is sufficient to fully describe the illustrative embodiments.

The die 100 further includes pads 52 over the substrate 50. The pads 52 may be formed over and in electrical contact with the interconnect structure in the substrate (not shown) in order to help provide external connections to the integrated circuit devices. The pads 52 are on what may be referred to as an active side of the die 100. In some embodiments, the pads 52 are formed by forming recesses (not shown) into a dielectric layer (not shown) or the substrate 50. The recesses may be formed to allow the pads 52 to be embedded into the dielectric layer and/or substrate 50. In other embodiments, the recesses are omitted as the pads 52 may be formed on the dielectric layer or substrate 50. The pads 52 may include a thin seed layer (not shown) made of copper, titanium, nickel, gold, tin, the like, or a combination thereof. The conductive material of the pads 52 may be deposited over the thin seed layer. The conductive material may be formed by an electro-chemical plating process, chemical vapor deposition (CVD), physical vapor deposition (PVD), atomic layer deposition (ALD), the like, or a combination thereof. In an embodiment, the conductive material of the pads 52 is copper, tungsten, aluminum, silver, gold, tin, the like, or a combination thereof. The pads 52 may be formed to have a thickness of between about 0.5 μm and about 4 μm.

One pad 52 is illustrated in the die 100 for clarity and simplicity, and one of ordinary skill in the art will readily understand that more than one pad 52 may be present.

A passivation film 54 may be formed on the substrate 50 and over the pad 52 as illustrated in FIG. 1. The passivation film 54 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The passivation film 54 may be formed through a process such as CVD, PVD, ALD, a spin-on-dielectric process, the like, or a combination thereof, and may have a thickness between about 0.5 μm and about 30 μm. In some embodiments, a top surface of pad 52, and a portion of a bottom surface of the passivation film 54 are level.

An opening is formed through the passivation film 54 to expose a portion of the pad 52. The opening may be formed by, for example, etching, milling, laser techniques, the like, or a combination thereof.

Figure 2:
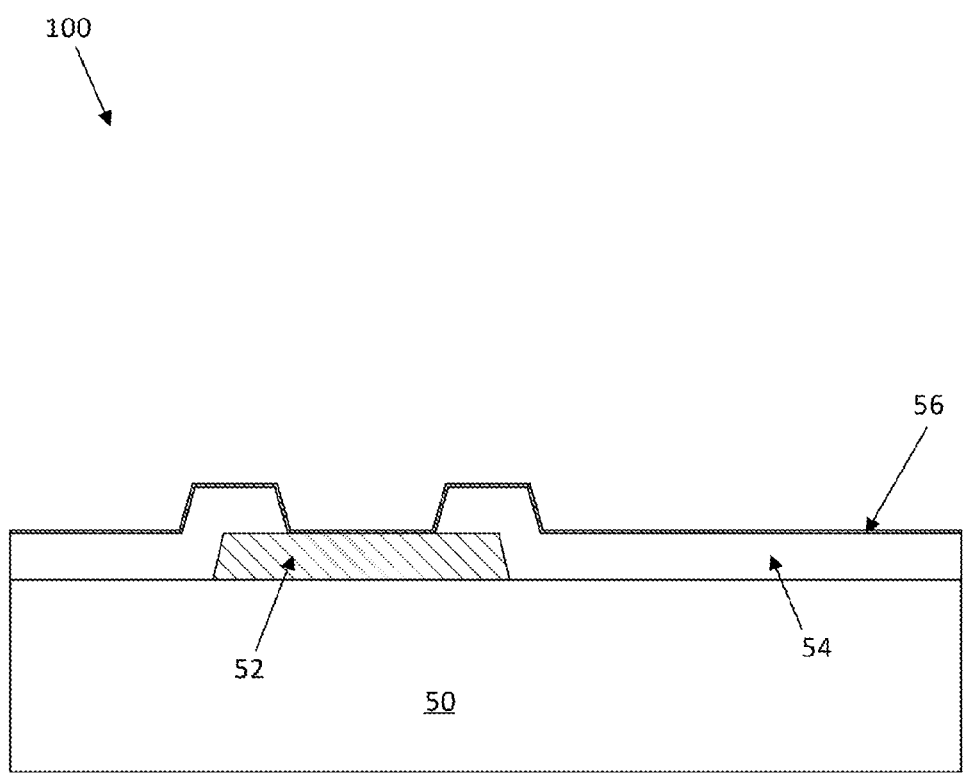

FIG. 2 illustrates the formation of a seed layer 56 over the substrate 50, the passivation film 54, and the pad 52. The seed layer 56 directly contacts a top surface of the pad 52 in the opening of the passivation film 54. In some embodiments, the seed layer 56 is a metal layer, which may be a single layer or a composite layer comprising a plurality of sub-layers formed of different materials. The seed layer 56 may be formed of copper, titanium, nickel, gold, the like, or a combination thereof. In some embodiments, the seed layer 56 includes a titanium layer and a copper layer over the titanium layer. The seed layer 56 may be formed using, for example, PVD or the like.

Figure 3:
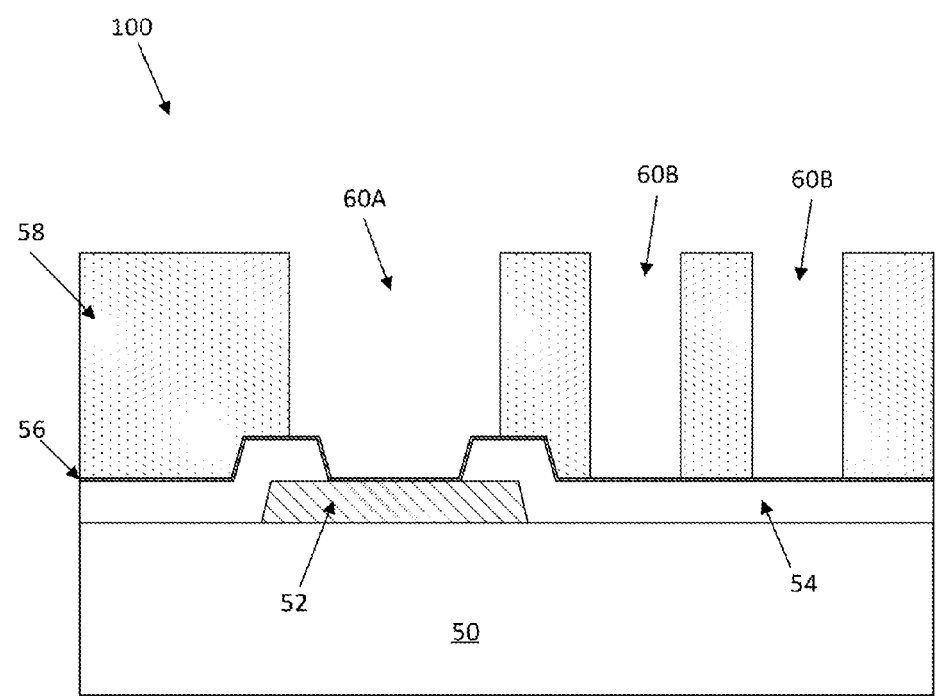

FIG. 3 illustrates the formation and patterning of a photo resist 58 over the seed layer 56. In some embodiments, the photo resist 58 is formed and patterned on the seed layer 56 and then the conductive features 62 and 64 are formed in the patterned photo resist 58 (see FIG. 4). The photo resist 58 may be formed by a wet process, such as a spin-on process, or by a dry process, such as by applying a dry film. A plurality of openings 60 may be formed in the photo resist 58 to expose the underlying seed layer 56. The opening 60A is formed over the pad 52 while the openings 60B are formed over the passivation film 54.

Figure 4:
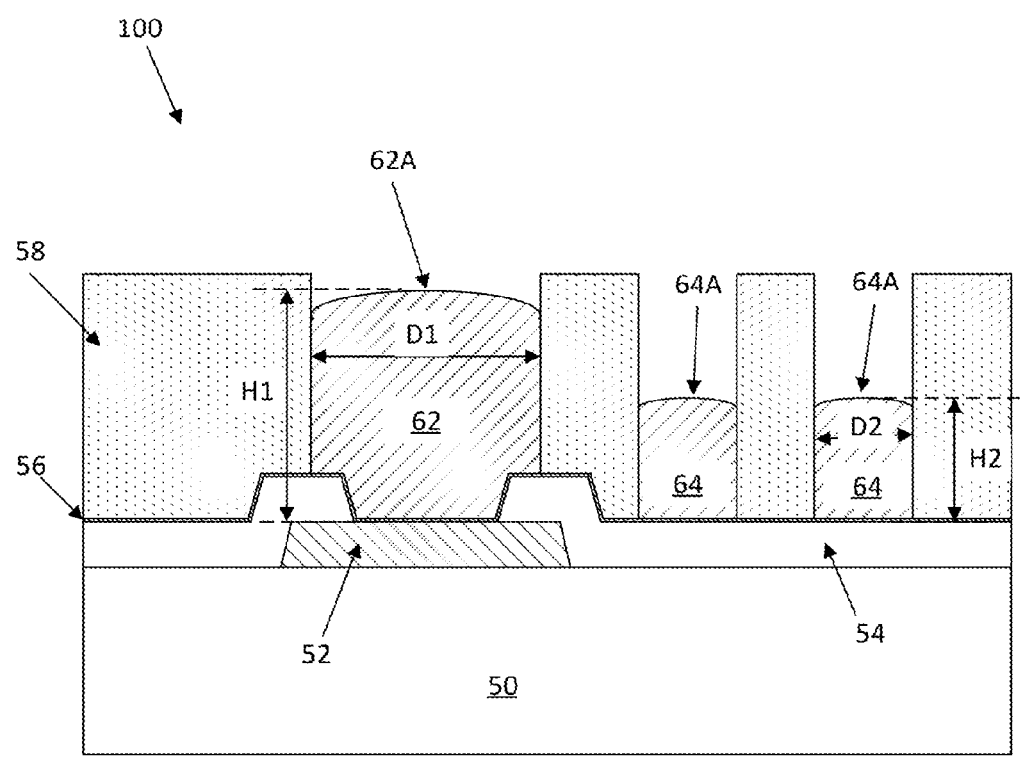

FIG. 4 illustrates the formation of the conductive features 62 and 64 in the openings 60A and 60B, respectively. The conductive features 62 and 64 illustrated in FIG. 4 have convex top surfaces 62A and 64A, respectively. In another embodiment, the top surfaces 62A and 64A of the conductive features 62 and 64 may be substantially planar (not shown) or concave (not shown). The shape/profile of the top surfaces 62A and 64A of the conductive features 62 and 64 may be controlled by the parameters of the process utilized to form the conductive features 62 and 64. In addition, the formation process parameters may be controlled to have different formation rates for the conductive feature 62 and the conductive features 64 based on their difference in size (e.g. feature diameter, feature top surface area). These differences in the formation rate can provide a feature height differentiation (e.g. H1 vs. H2) for conductive features 62 and 64 that are formed in the same formation step.

In some embodiments, the conductive features 62 and 64 are formed by plating, such as electroplating or electroless plating, or the like. The conductive features 62 and 64 may be formed of a metal, like copper, aluminum, nickel, gold, silver, palladium, tin, the like, or a combination thereof, and may have a composite structure including a plurality of layers. In some embodiments, the conductive feature 62 has a diameter D1 that is greater than about 40 μm. In an embodiment, the diameter D1 is in a range from about 40 μm to about 100 μm. In some embodiments the conductive features 64 have diameters D2 that is less than about 20 μm. In an embodiment, the diameter D2 is in a range from about 1 μm to about 20 μm. In some embodiments, the ratio of diameters D1/D2 is in a range from about 1 to about 100. The conductive feature 62 is formed to have a height H1 and the conductive features 64 are formed to have heights H2. In some embodiments, the height H1 is at least 50% greater than the height H2. For example, if the conductive features 64 are formed to have a height H2 of about 20 μm, then the conductive features 62 is formed to have a height H1 of at least about 30 μm.

In some embodiments, additive chemicals known as accelerators, suppressors, and levelers may be added to the plating solution based on the configuration of the conductive features.

In the embodiment where the conductive features 62 and 64 are formed by electroplating, the height differentiation (H1 vs. H2) of the conductive features 62 and 64 may be achieved by varying parameters of the plating process, such as the current density, the plating solution, the plating solution temperature, the plating timespan, the plating tool chamber flow, the height of the photo resist 58, or a combination thereof. For example, at lower current densities (e.g. 10 mA/cm$^2$ and less) the plating rate of the electroplating process is largely affected by the fluidic friction between the plating solution and the photo resist 58. This fluidic friction slows and/or demobilizes the plating source ions near the photo resist 58 such that the narrow openings in the photo resist 58 for the conductive features 64 significantly reduce the amount of plating source ions that may reach the cathode (e.g. seed layer 56 and conductive feature 64) in these narrow openings. Similarly, fluidic friction slows and/or demobilizes the plating source ions near the photo resist 58 of the wider opening for the conductive feature 62, but the wider opening has a larger area that is not affected by the fluidic friction (e.g. middle portion of opening) such that plating source ions may more quickly and easily reach the conductive feature 62. In addition, during the plating process, regions of gradient ion concentration (sometimes referred to as diffusion layers) are formed near the conductive features (62 and 64) and the diffusion layer in the wider opening for conductive feature 62 can be thinner which can induce a current crowing effect. Further, the middle portions of the conductive features 62 and 64 plate faster than the edge portions which can be due to fluidic friction and/or an accelerator additive, which causes the convex top surfaces 62A and 64A. Hence, at lower current densities, the conductive feature 62 may plate at a faster rate than the conductive features 62, and thus, may reach a greater height than the conductive features 64 in the same amount of time (e.g. the same timespan). Moreover, at higher current densities (e.g. 20 mA/cm$^2$ and less) the plating rate of the electroplating process is largely affected by the magnetic field of the plating process such that the smaller features may plate more quickly due to current crowding near the photo resist 58.

Figure 5:
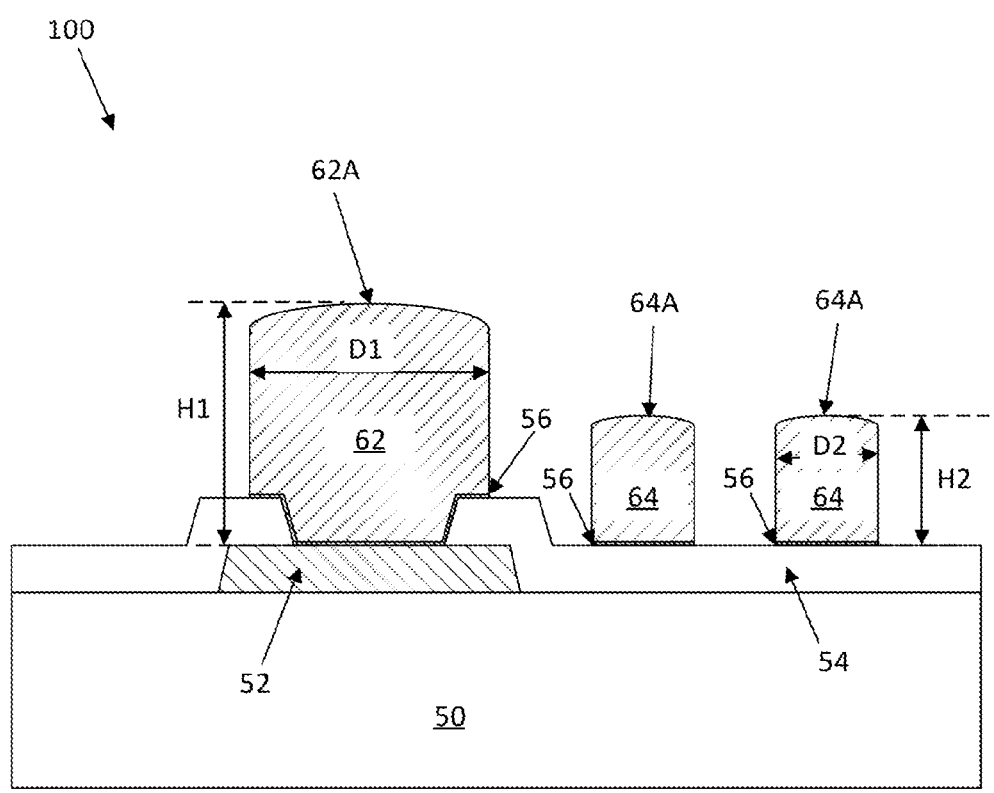

FIG. 5 illustrates the conductive features 62 and 64 after the removal of the photo resist 58 and the seed layer 56 outside of the conductive features 62 and 64. The photo resist 58 and the seed layer 56 may be removed through suitable removal processes such as ashing, etch processes, the like, or a combination thereof.

One conductive feature 62 and two conductive features 64 are illustrated in the die 100 for clarity and simplicity, and one of ordinary skill in the art will readily understand that more than one conductive feature 62 and more or less than two conductive features 64 may be present.

Figure 6:
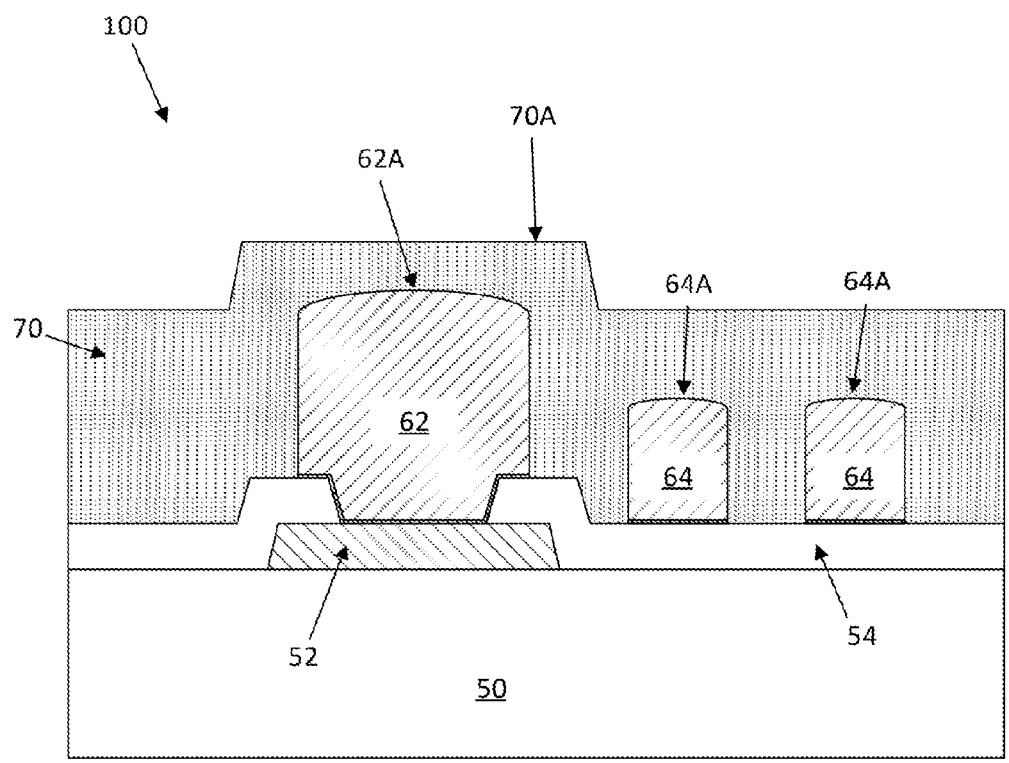

FIG. 6 illustrates the formation of a dielectric material 70 on the active side of the integrated circuit die 100, such as on the passivation film 54 and the conductive features 62 and 64. The dielectric material 70 may encapsulate the conductive features 62 and 64. In some embodiments, the dielectric material 70 is laterally coterminous with the die 100. The dielectric material 70 may be a polymer, such as polybenzoxazole (PBO), polyimide, benzocyclobutene (BCB), or the like. In other embodiments, the dielectric material 70 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric material 70 may be formed by any acceptable deposition process, such as spin coating, CVD, laminating, the like, or a combination thereof.

Figure 7:
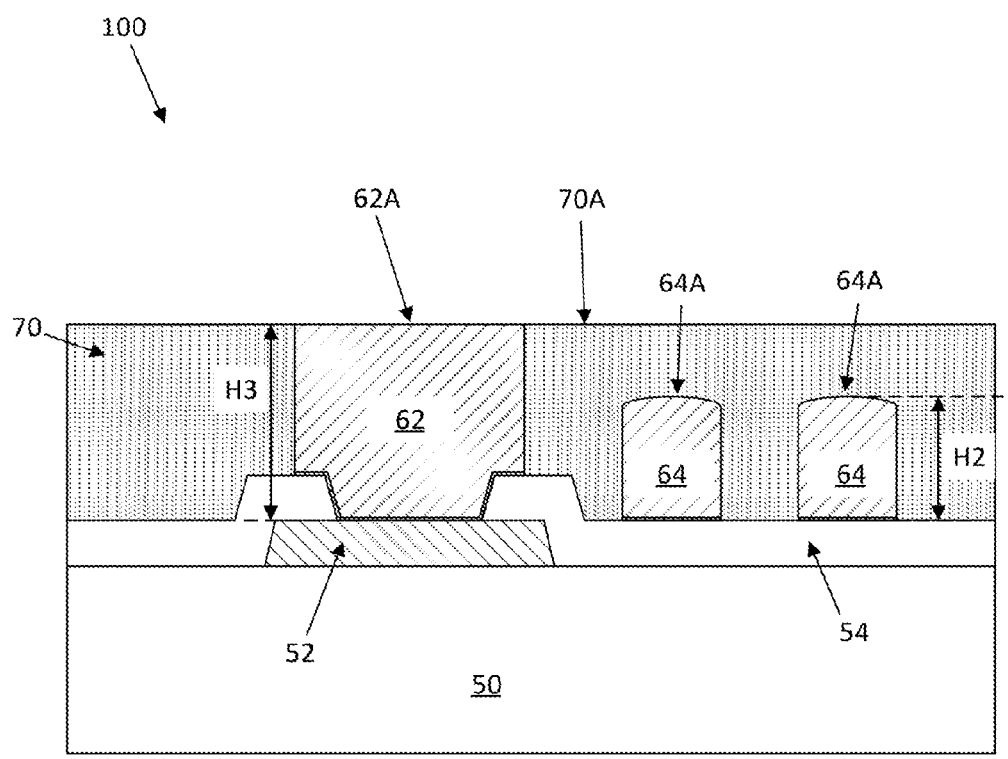

In some embodiments, the conductive features 62 and 64 are buried in the dielectric material 70, and a planarization step, such as a grinding, is performed on the dielectric material 70 as illustrated in FIG. 7. The planarization step is used to remove excess portions of the dielectric material 70, which excess portions are over top surface 62A of the conductive feature 62. In some embodiments, top surfaces 62A of the conductive feature 62 are exposed and planarized, and are level with a surface 70A of the dielectric material 70. In these embodiments, the conductive feature 62 is planarized to have a height H3. Even though the height H3 may be less the height H1 (conductive feature 62 height before planarization), the height H3 of the conductive features 62 after planarization is greater than the height H2 of the conductive features 64. The difference between the heights H3 and H2 is sufficient to isolate the conductive features 64 from another conductive feature (e.g. conductive feature 80) formed on the top surface 70A of the dielectric material 70. As illustrated the conductive feature 62 extends to the surface 70A of the dielectric material 70 and may be used as a via to the next conductive layer (see 78 and 80 in FIG. 9) and may be referred to as a conductive via 62 hereinafter. Further, the conductive features 64 are embedded within the dielectric material 70 and are isolated from the next conductive layer (see 78 and 80 in FIG. 9) and may be used as conductive lines and may be referred to as conductive lines 64 hereinafter. The conductive feature 62 may also be referred to a pillar or a microbump.

After the planarization step, the conductive via 62 and the conductive lines 64 are in the same conductive layer of the interconnect structure of the die 100 with the conductive via 62 having a planar top surface and the conductive lines 64 having non-planar (convex) top surfaces.

Figure 8:
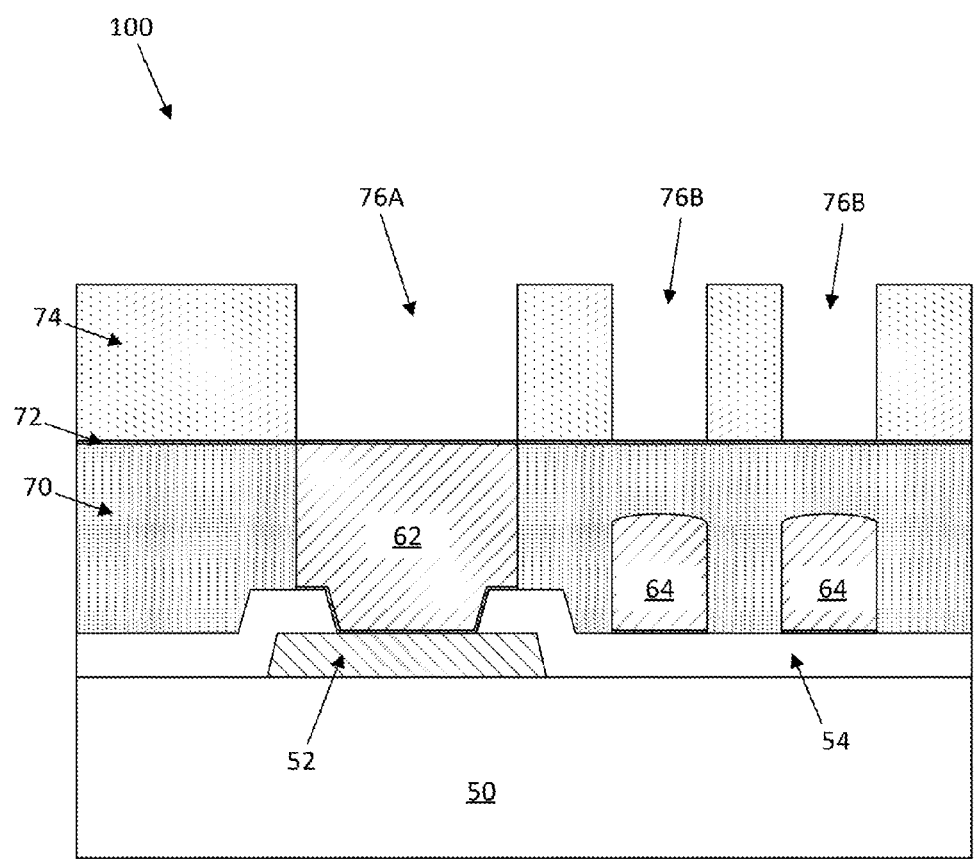

FIG. 8 illustrates the formation of a seed layer 72 and the formation and patterning of a photo resist 74 over the dielectric material 70, the conductive via 62, and the conductive lines 64. The seed layer 72 directly contacts the conductive via 62. In some embodiments, the seed layer 72 is a metal layer, which may be a single layer or a composite layer comprising a plurality of sub-layers formed of different materials. The seed layer 72 may be formed of copper, titanium, nickel, gold, the like, or a combination thereof. In some embodiments, the seed layer 72 includes a titanium layer and a copper layer over the titanium layer. The seed layer 72 may be formed using, for example, PVD or the like.

In some embodiments, the photo resist 74 is formed and patterned on the seed layer 72 and then the conductive features 78 and 80 (see FIG. 9) are formed in the patterned photo resist 7. The photo resist 74 may be formed by a wet process, such as a spin-on process, or by a dry process, such as by applying a dry film. A plurality of openings 76 may be formed in the photo resist 74 to expose the underlying seed layer 72. The opening 76A is formed over the conductive via 62 while the openings 76B are formed over the dielectric material 70. In some embodiments, the openings 76B are omitted.

Figure 9:
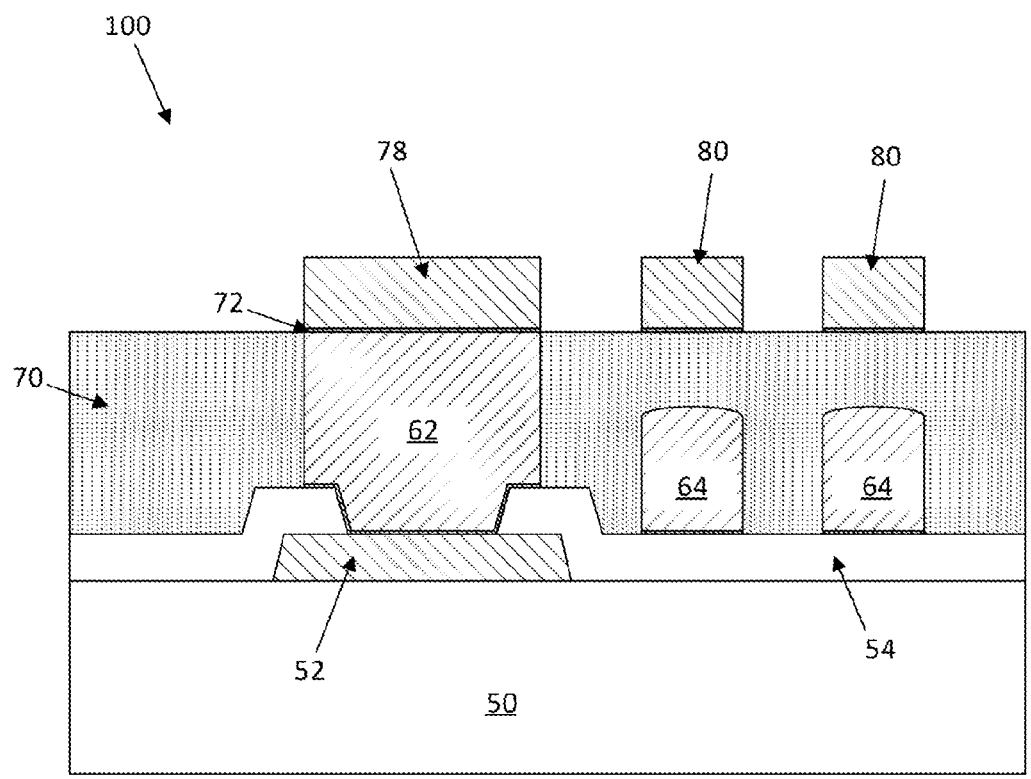

FIG. 9 illustrates the formation of the conductive features 78 and 80 and the removal of the photo resist 74 and the portions of the seed layer 72 outside of the conductive features 78 and 80. In some embodiments, the conductive features 78 and 80 are formed by CVD, ALD, PVD, sputtering, or the like, or plating, such as electroplating or electroless plating, or the like. The conductive features 78 and 80 may be formed of a metal, like copper, aluminum, nickel, gold, silver, palladium, tin, the like, or a combination thereof, and may have a composite structure including a plurality of layers. In some embodiments, the conductive features 78 and 80 are formed by a similar process as the conductive features 62 and 64 such that the conductive feature 78 may have a height than is at least 50% higher than heights of the conductive features 80. In some embodiments, the conductive features 78 and 80 are formed to have a same height or are planarized to have a same height.

Although not shown, another dielectric material (similar to dielectric material 70) may be formed over the conductive features 78 and 80, which may be followed by the formation of another layer of conductive features. This process may be repeated as many times as necessary for the design of the interconnect structure of the die 100.

By controlling the plating process to have different plating rates for different conductive feature sizes, a height differentiation for conductive features that are formed in the same plating step can be achieved. This feature height differentiation allows for the larger conductive features to, for example, act as vias to the next level of the interconnect structure, while the smaller features can be conductive lines/structures within the current interconnect level. Because the conductive vias and the conductive lines are both formed in the same process at the same time, there number of patterning steps and passivation/dielectric layers are reduced. This reduction in patterning steps and passivation/dielectric layers can further cause a reduction in the stress and warpage on the die because many passivation/dielectric layers require curing steps, which can cause stress and warpage on the die.

Figure 10:
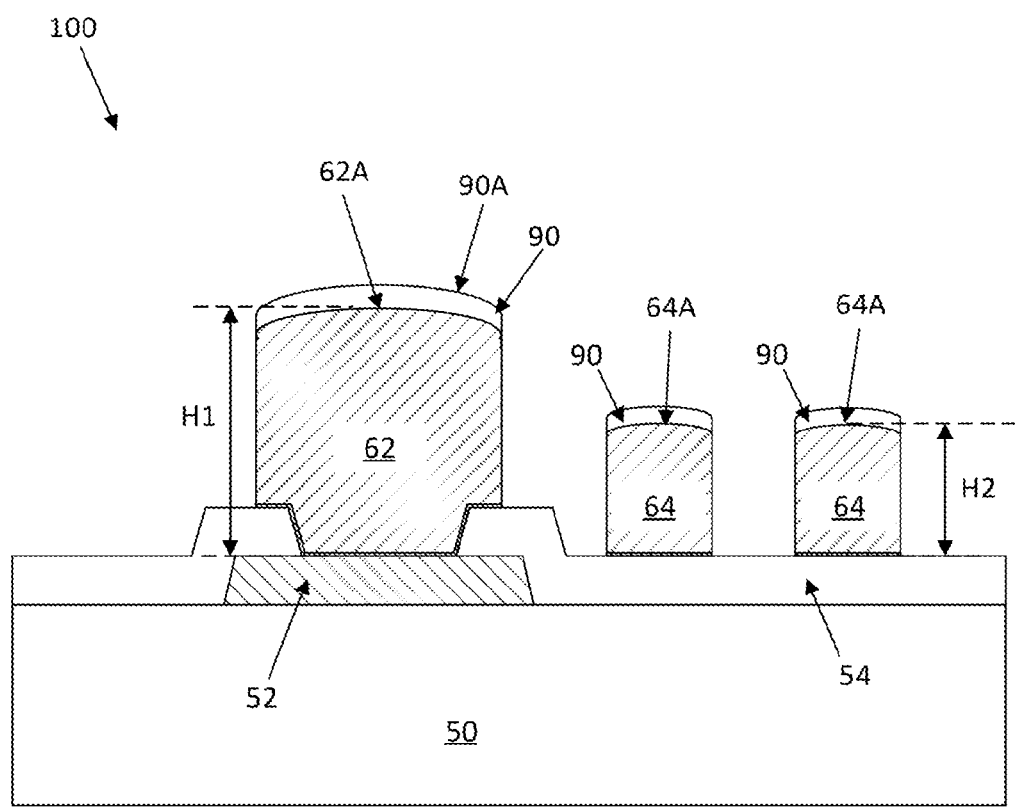
FIGS. 10 through 13 illustrate cross sectional views of intermediate steps during a process for forming and testing a semiconductor device in accordance with some embodiments.

FIGS. 10 through 13 illustrate cross sectional views of intermediate steps during a process for forming and testing a semiconductor device in accordance with some embodiments. FIG. 10 illustrates the die 100 at an intermediate step of processing similar to the step illustrated in FIG. 5. Details regarding this embodiment that are similar to those for the previously described embodiment will not be repeated herein.

The embodiment in FIG. 10 includes a metal cap layer 90 on top surfaces 62A and 64A of the conductive via 62 and the conductive lines 64, respectively. The metal cap layer 90 may include nickel, tin, tin-lead, gold, silver, palladium, indium, nickel-palladium-gold, nickel-gold, the like, or a combination thereof and may be formed by a plating process. In some embodiments, the time span for the plating process to form the metal cap layer 90 is less than the time span for the plating process to form the conductive features 62 and 64. In an embodiment, the plating process to form the metal cap layer 90 is performed for less than 100 seconds, such as in a range from about 30 seconds to about 75 seconds. The metal cap layers 90 have top surfaces 90A that conform to the top surfaces 62A and 64A of the conductive via 62 and the conductive lines 64, respectively. In some embodiments, the metal cap layers 90 have convex top surfaces 90A.

Figure 11A:
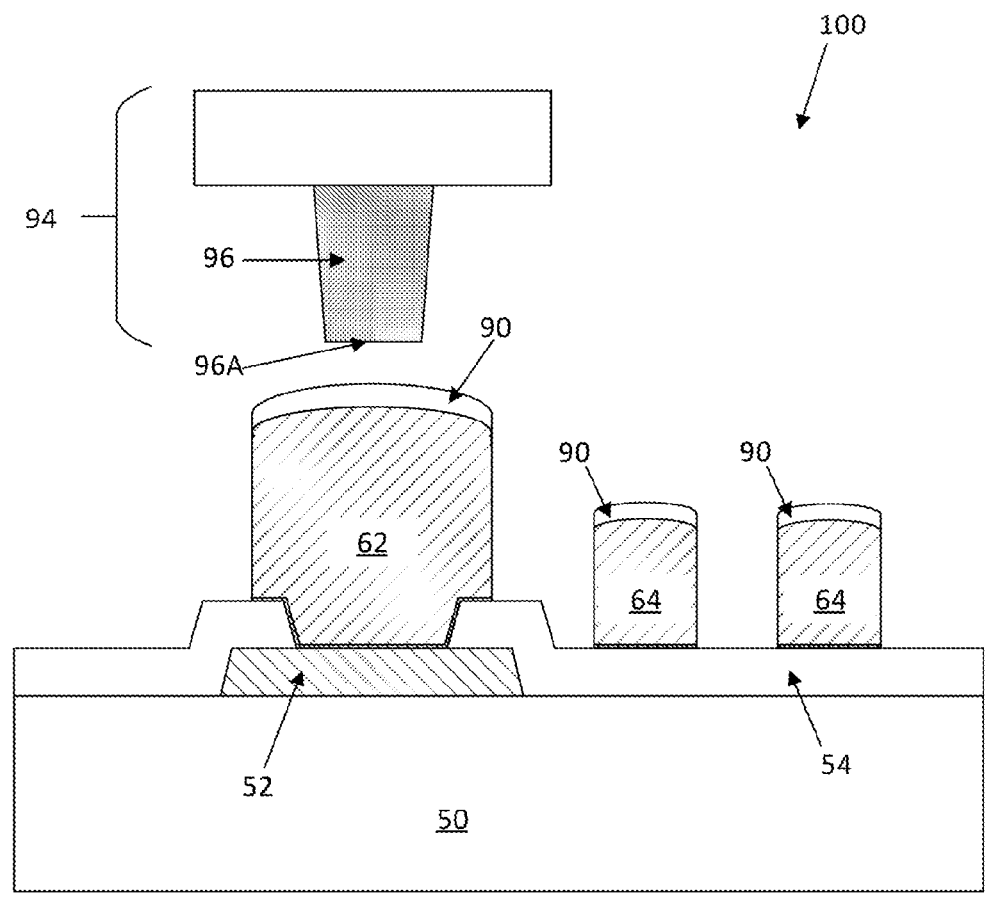
Figure 11B:
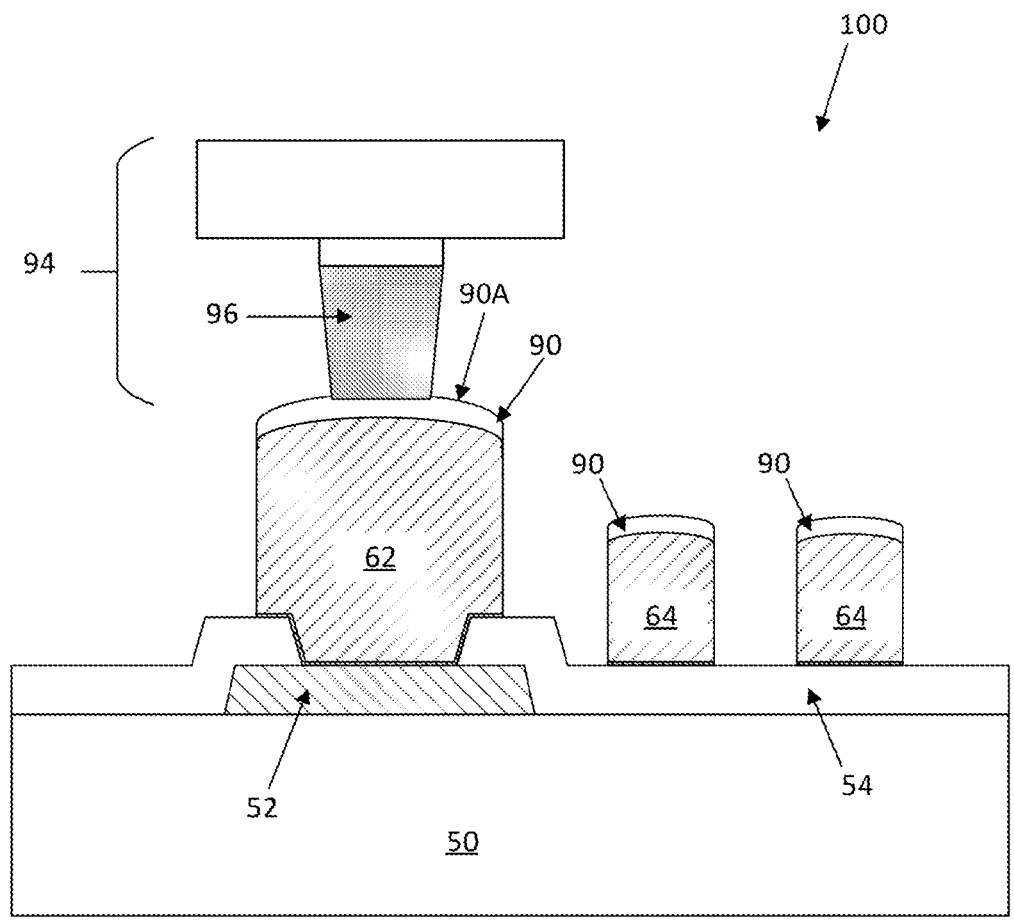

FIGS. 11A and 11B illustrate the use of a test structure 94 with a probe contact 96 to perform testing on the die 100 during processing. The testing may be performed in-situ with the formation of the die 100 and may allow for the yield of the die 100 to be monitored. The metal cap layer 90 allows for the probe contact 96 of the test structure 94 to have a flat end 96A (as opposed to a pointed end) which does not damage the conductive features 62 and/or metal cap layer 90. The metal cap layer 90 also allows for a quick and reliable connection between the probe contact 96 and the conductive via 62. In some embodiments, the metal cap layer 90 does not oxidize which allows for a more reliable contact between the probe contact 96 and the conductive via 62. The flat ended probe contact 96 the conductive via 62 with the metal cap layer 90 allow for the testing rate (wafers per hour) to be increased by about 7-8 times as compared to a pointed probe contact being used on an aluminum pad.

Figure 12:
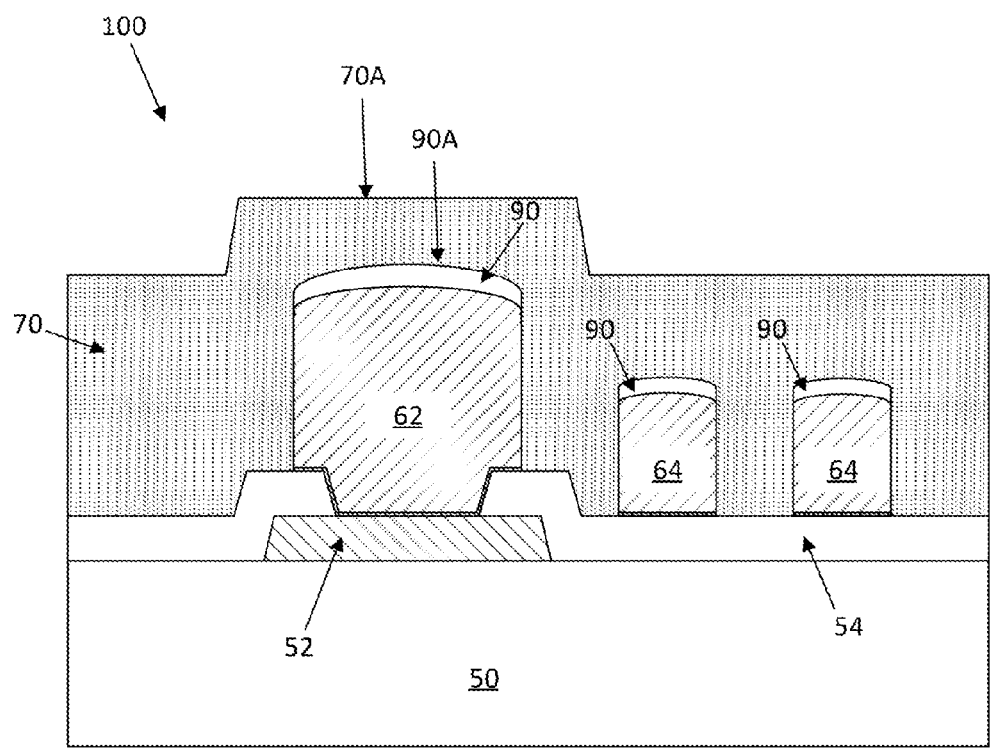

FIG. 12 illustrates the formation of the dielectric material 70 on the active side of the integrated circuit die 100, such as on the passivation film 54, the conductive features 62 and 64, and the metal cap layer 90. The dielectric material 70 may encapsulate the conductive features 62 and 64 and the metal cap layers 90. In some embodiments, the dielectric material 70 is laterally coterminous with the die 100. The dielectric material 70 may be a polymer, such as PBO, polyimide, BCB, or the like. In other embodiments, the dielectric material 70 is formed of a nitride such as silicon nitride; an oxide such as silicon oxide, PSG, BSG, BPSG, or the like; or the like. The dielectric material 70 may be formed by any acceptable deposition process, such as spin coating, CVD, laminating, the like, or a combination thereof.

Figure 13:
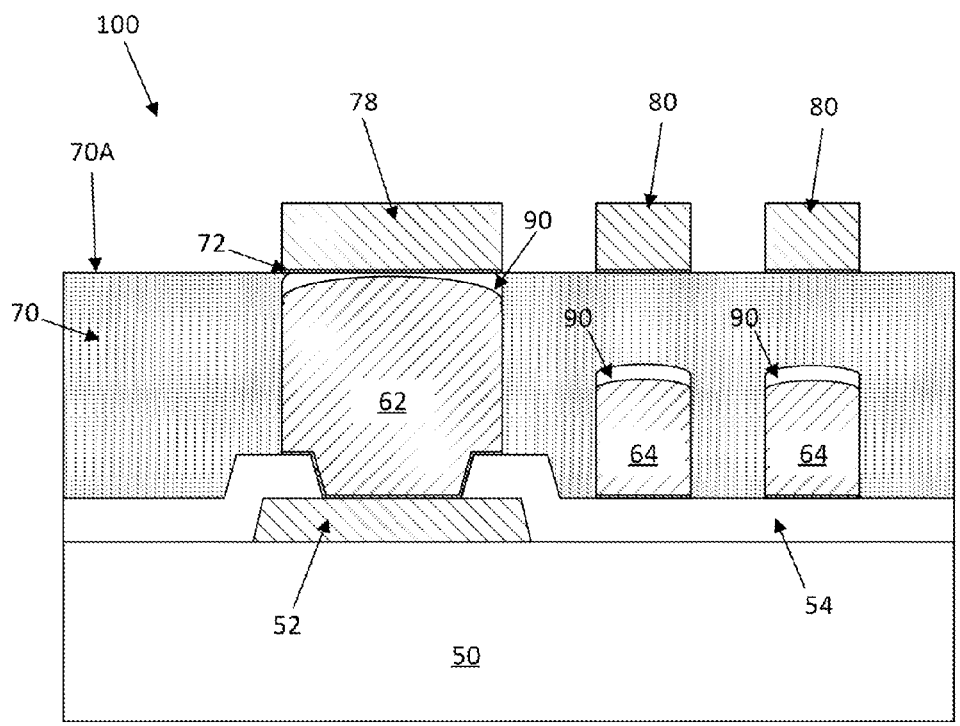

In some embodiments, the conductive features 62 and 64 and metal cap layers 90 are buried in the dielectric material 70, and a planarization step, such as a grinding, is performed on the dielectric material 70 as illustrated in FIG. 13. The planarization step is used to remove excess portions of the dielectric material 70, which excess portions are over top surface 62A of the conductive feature 62. In some embodiments, at least a portion of the metal cap layer 90 on the conductive feature 62 remains and is planarized to have a planar top surface and is level with a surface 70A of the dielectric material 70.

After the planarization step, the seed layer 72 and the conductive features 78 and 80 may be formed. The formation of these structures has been described above and the description is not repeated herein.

By having the metal cap layer 90 over the conductive via 62, the end of the probe contact 96 can be flat (as opposed to a pointed end) which does not damage the conductive via 62 and/or metal cap layer 90. Further, the flat ended probe contact 96 the conductive via 62 with the metal cap layer 90 allow for the testing rate (wafers per hour) to be increased by about 7-8 times as compared to a pointed probe contact being used on an aluminum pad.

Figure 14:
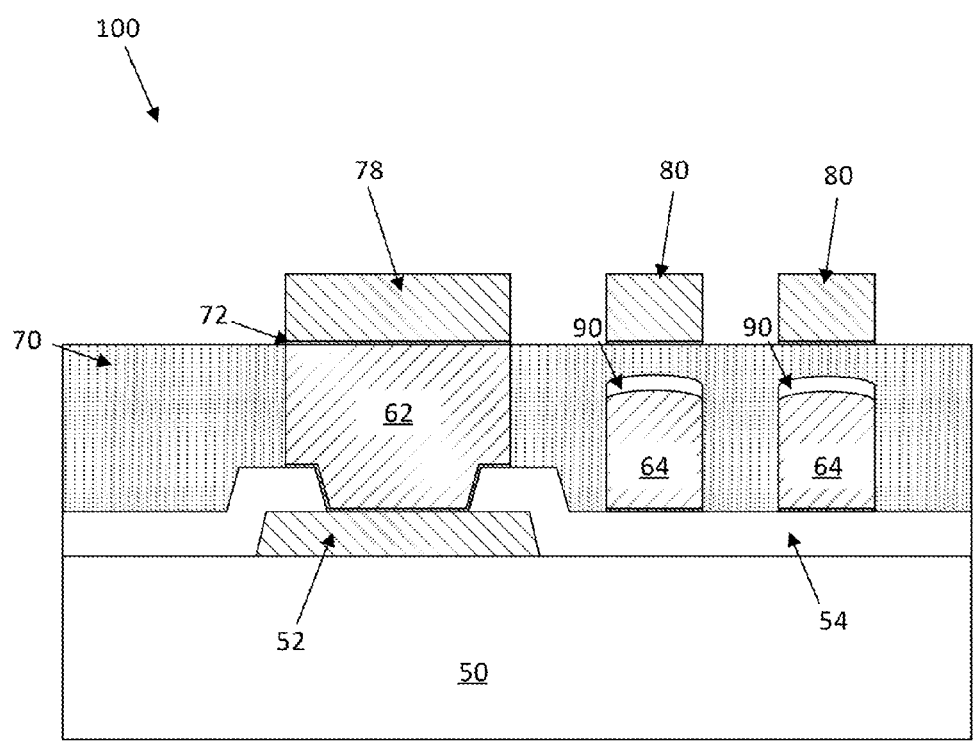
FIGS. 14, 15, and 16 illustrate cross sectional views of semiconductor devices in accordance with some embodiments.
Figure 15:
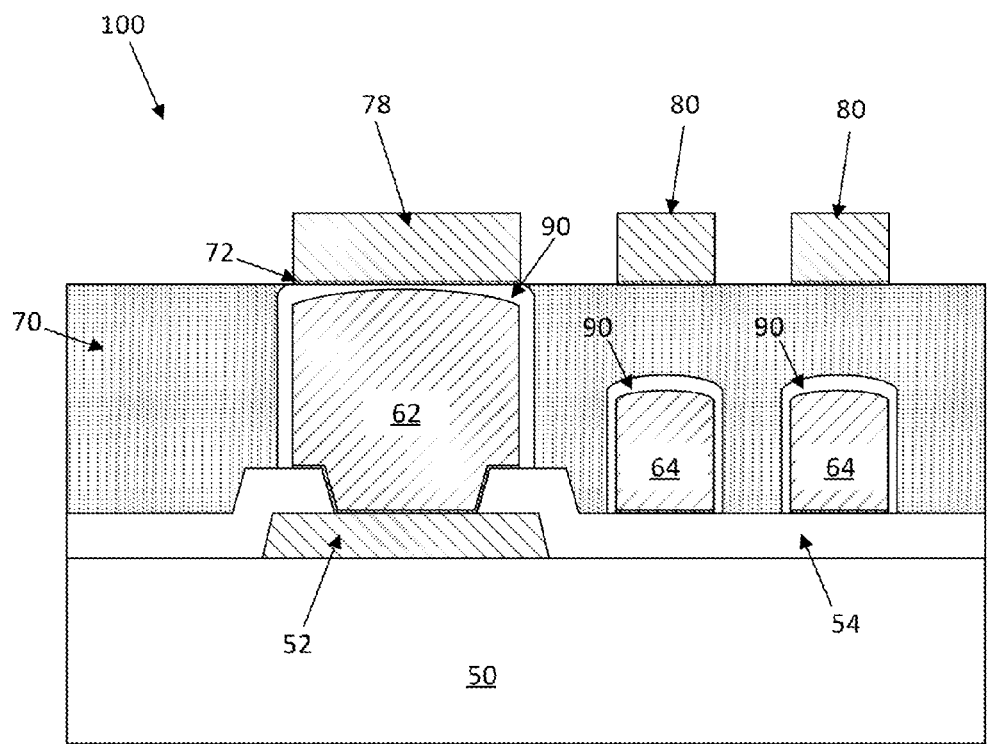
Figure 16:
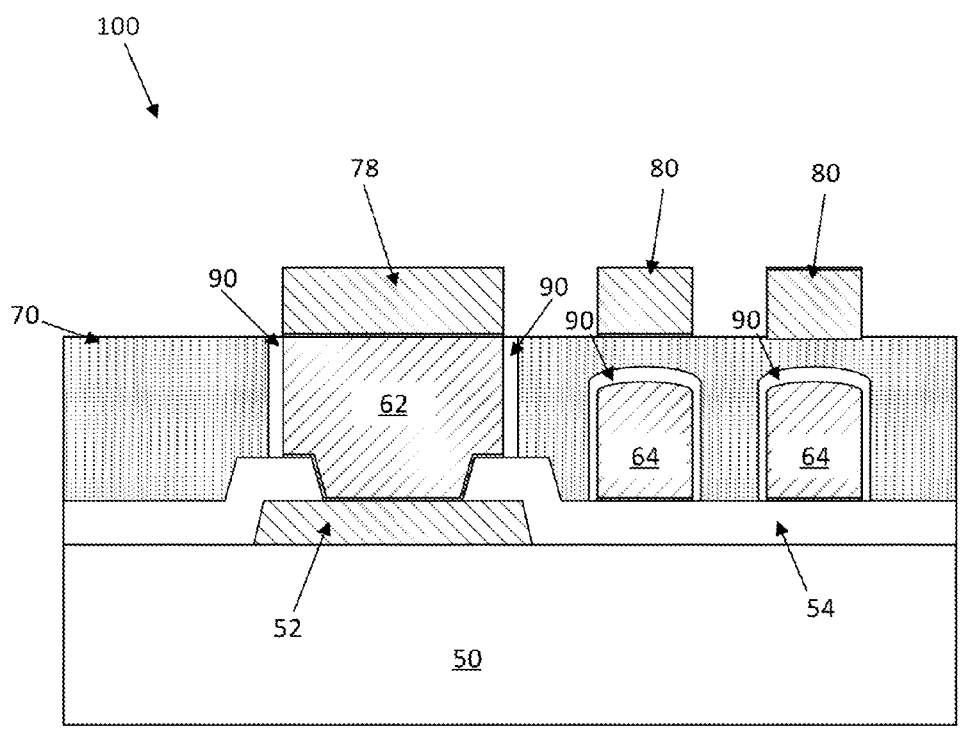

FIGS. 14, 15, and 16 illustrate cross sectional views of semiconductor devices in accordance with some embodiments. The embodiment in FIG. 14 is similar to the embodiment illustrated in FIG. 13 except that in the embodiment in FIG. 14, substantially all of the metal cap layer 90 on the conductive feature 62 is removed such that top surfaces 62A of the conductive feature 62 are exposed and planarized, and are level with a surface 70A of the dielectric material 70.

FIG. 15 illustrates an embodiment similar to the previously described embodiment in FIG. 13 except in FIG. 15 the metal cap layer 90 extends to the sidewalls of the conductive via 62 and the conductive lines 64. Details regarding this embodiment that are similar to those for the previously described embodiment will not be repeated herein.

The metal cap layer 90 in FIG. 15 may be formed similar to the metal cap layer 90 in FIG. 13 except that the plating process to form the metal cap layer 90 in FIG. 15 is performed for a longer period of time than the embodiment of FIG. 13 to allow for the formation on the sidewalls of the conductive via 62 and the conductive lines 64.

FIG. 16 illustrates an embodiment similar to the embodiment illustrated in FIG. 15 except that in the embodiment in FIG. 16, substantially all of the metal cap layer 90 on the top surface of the conductive feature 62 is removed such that top surfaces 62A of the conductive feature 62 are exposed and planarized, and are level with a surface 70A of the dielectric material 70. After the planarization step, the metal cap layer 90 is only on the sidewalls of the conductive via 62 while the metal cap layer 90 is on top surfaces and sidewalls of the conductive lines 64.

Figure 17:
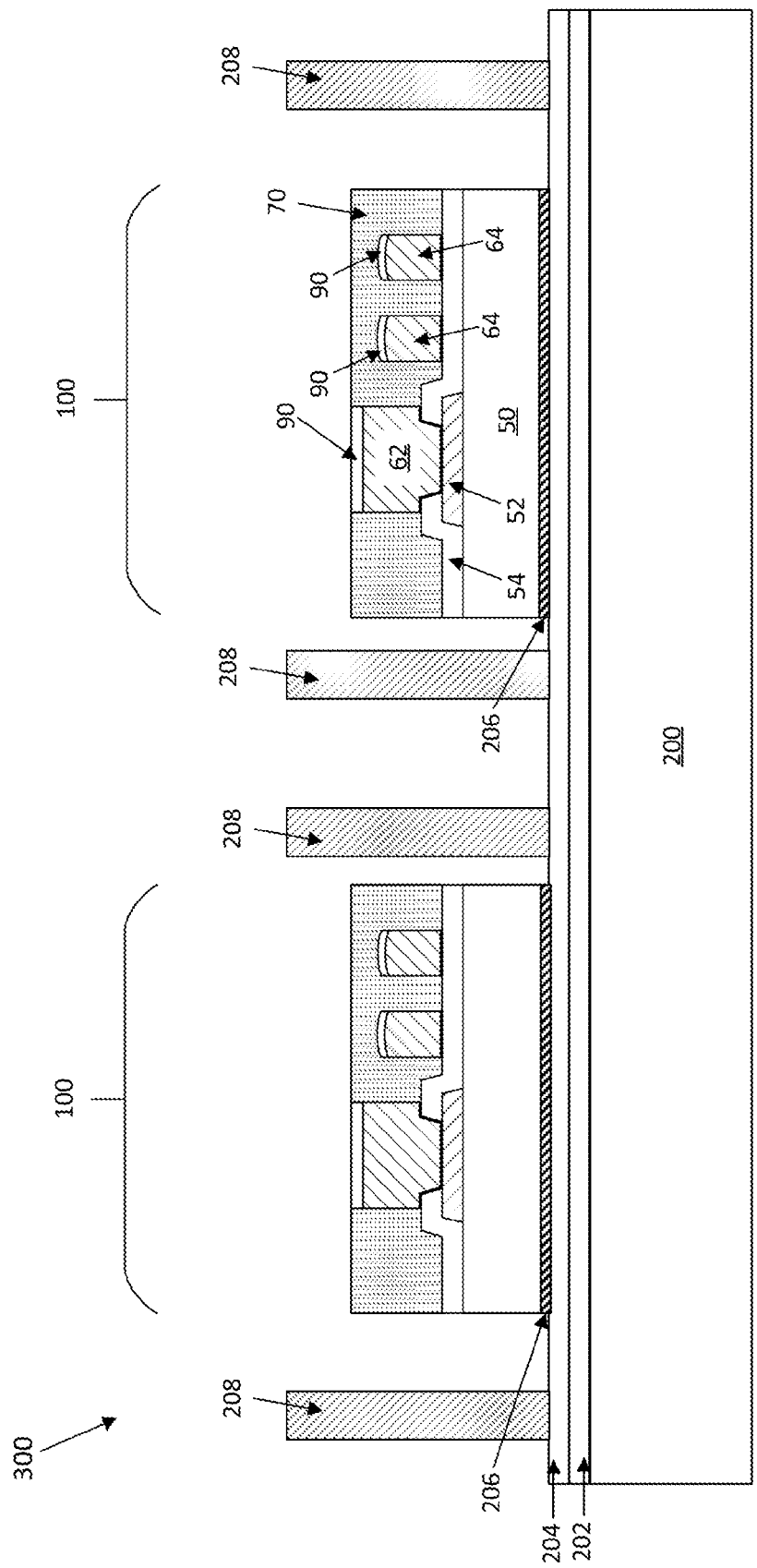
FIGS. 17 through 24 illustrate cross sectional views of intermediate steps during a process for forming a package-on-package (PoP) structure in accordance with some embodiments.

FIGS. 17 through 24 illustrate cross sectional views of intermediate steps during a process for forming a package-on-package (PoP) structure in accordance with some embodiments. FIG. 17 illustrates an intermediate step in the formation of first package(s) 300 including a carrier substrate 200, an adhesive layer 202 over a carrier substrate 200, and a dielectric layer 204 over the adhesive layer 202. The carrier substrate 200 may be any suitable substrate that provides (during intermediary operations of the fabrication process) mechanical support for the layers over the carrier substrate 200. The carrier substrate 200 may be a wafer including glass, silicon (e.g., a silicon wafer), silicon oxide, metal plate, a ceramic material, or the like.

The adhesive layer 202 may be disposed, for example laminated, on the carrier substrate 200. The adhesive layer 202 may be formed of a glue, such as an ultra-violet (UV) glue which loses its adhesive property when exposed to UV lights, a light-to-heat conversion (LTHC) material which loses its adhesive property when heated, or the like. The adhesive layer 202 may be dispensed as a liquid and cured, may be a laminate film laminated onto the carrier substrate 200, or may be the like. The top surface of the adhesive layer 202 may be leveled and may have a high degree of coplanarity.

The dielectric layer 204 is formed over the adhesive layer 202. The dielectric layer 204 can be silicon nitride, silicon carbide, silicon oxide, low-k dielectrics such as carbon doped oxides, extremely low-k dielectrics such as porous carbon doped silicon dioxide, a polymer, such as an epoxy, polyimide, BCB, PBO, the like, or a combination thereof, although other relatively soft, often organic, dielectric materials can also be used. The dielectric layer 204 may be deposited by CVD, PVD, ALD, a spin-on-dielectric process, the like, or a combination thereof.

In some embodiments, the dielectric layer 204 may be a back side redistribution structure 204. The back side redistribution structure 204 may be formed of alternating layers of dielectric (e.g., low-k dielectric material) and conductive material (e.g., copper) and may be formed through any suitable process (such as deposition, damascene, dual damascene, etc.). The conductive and dielectric layers may include metal lines and vias (not shown).

Further in FIG. 17, electrical connectors 208 may be formed over a seed layer (not shown) and extend from the seed layer in a direction that is substantially perpendicular to a surface of the dielectric layer 204. In some embodiments, the electrical connectors 208 are formed by a plating process. In these embodiments, the electrical connectors 208 are made of copper, aluminum, nickel, gold, silver, palladium, tin, the like, or a combination thereof, and may have a composite structure including a plurality of layers. In these embodiments, a photoresist (not shown) may be formed over the carrier substrate 200. In some embodiments, the photoresist is formed and patterned on the seed layer and then the electrical connectors 208 are formed in the patterned photoresist. The photoresist may be formed by a wet process, such as a spin-on process, or by a dry process, such as by applying a dry film. A plurality of openings are formed in the photoresist to expose the underlying seed layer. A plating step is then performed to plate the electrical connectors 208.

In alternative embodiments, the electrical connectors 208 may be stud bumps, which are formed by wire bonding over the dielectric layer 204, and cutting the bond wire with a portion of bond wire left attached to the respective bond ball. For example, the electrical connectors 208 may include a lower portion and an upper portion, wherein the lower portion may be a bond ball (not shown) formed in the wire bonding, and the upper portion may be the remaining bond wire (not shown). The upper portion of the electrical connector 110 may have a uniform width and a uniform shape that are uniform throughout the top part, the middle part, and the bottom part of upper portion. The electrical connectors 208 may be formed of non-solder metallic materials that can be bonded by a wire bonder. In some embodiments, the electrical connectors 208 are made of copper wire, gold wire, the like, or a combination thereof, and may have a composite structure including a plurality of layers. In the wire bonding embodiments, the seed layer and the sacrificial layer may be omitted.

Further in FIG. 17, integrated circuit dies 100 are adhered to the dielectric layer 204 by an adhesive layer 206. Before being adhered to the dielectric layer 204, the integrated circuit dies 114 may be processed according to applicable manufacturing processes to form integrated circuits in the integrated circuit dies 100 (see FIGS. 1-16). The adhesive layer 206 may be any suitable adhesive, such as a die attach film or the like. The dies 100 may be a single die or may be more than two dies. The dies 100 may include a logic die, such as a central processing unit (CPU), a graphics processing unit (GPU), the like, or a combination thereof. In some embodiments, the dies 100 include a die stack (not shown) which may include both logic dies and memory dies. The dies 100 may include an input/output (I/O) die, such as a wide I/O die that provides a connection between a first package 300 and the subsequently attached second package 240 (see FIGS. 23 and 24). The dies 100 may include the conductive via 62 and the conductive lines 64 which are formed utilizing the plating height differentiation approached described above in FIGS. 1-16.

The conductive vias 62 of the dies 100 may be used as pads for the dies 100. One interconnect layer for the dies 100 is shown in for simplicity, although more than one interconnect layer for the dies 100 could be present.

Figure 18:
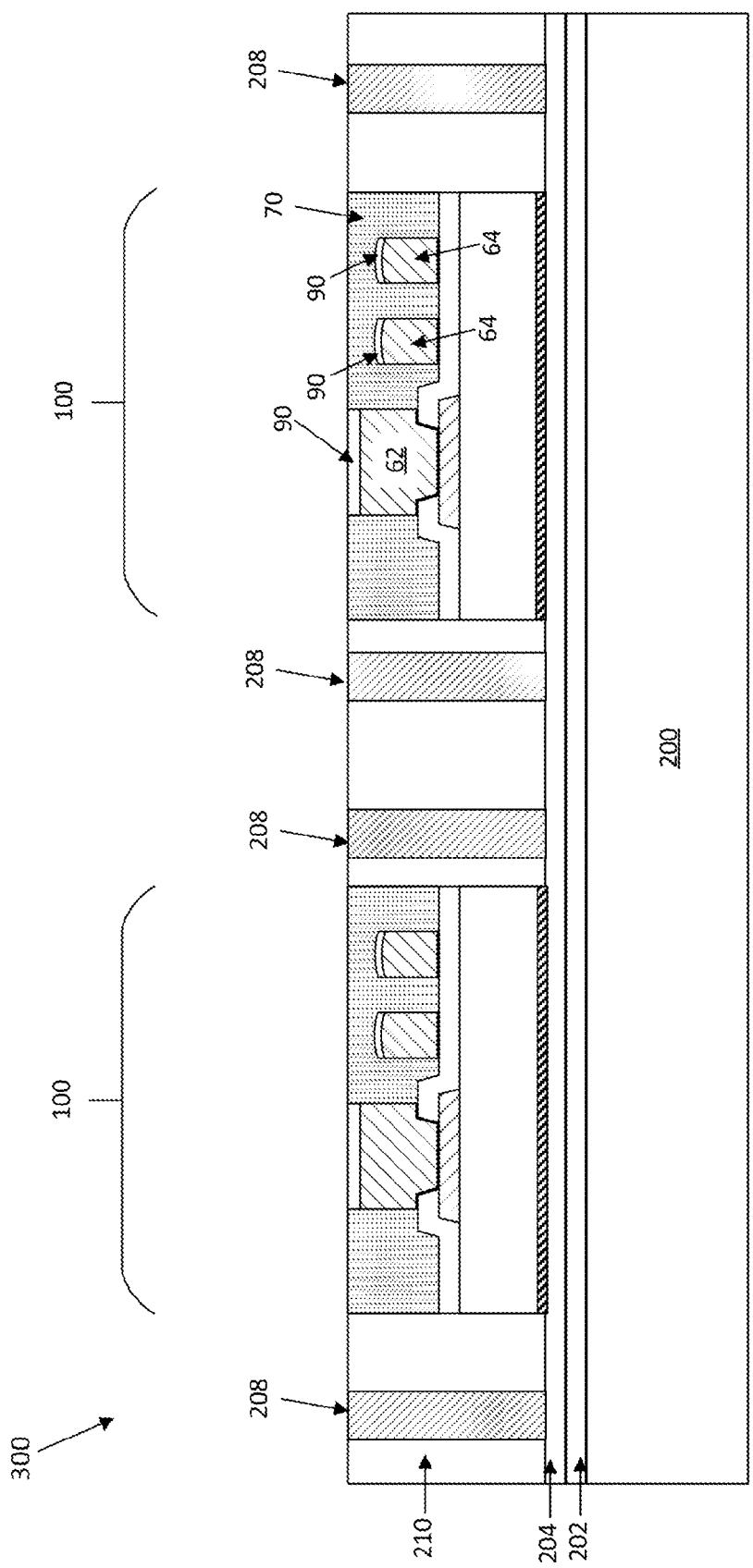

FIG. 18 illustrates the encapsulation of the dies 100 and the electrical connectors 208. In some embodiments, the dies 100 and the electrical connectors 208 are encapsulated by a molding material 210. The molding material 210 may be molded on the dies 100 and the electrical connectors 208, for example, using compression molding. In some embodiments, the molding material 210 is made of a molding compound, a polymer, an epoxy, silicon oxide filler material, the like, or a combination thereof. A curing step may be performed to cure the molding material 210, wherein the curing may be a thermal curing, a UV curing, the like, or a combination thereof.

In some embodiments, the dies 100, the conductive vias 62, and the electrical connectors 208 are buried in the molding material 210, and after the curing of the molding material 210, a planarization step, such as a grinding, is performed on the molding material 210 as illustrated in FIG. 18. The planarization step is used to remove excess portions of the molding material 210, which excess portions are over top surfaces of the conductive vias 62 and the electrical connectors 208. In some embodiments, surfaces of the conductive vias 62 and surfaces of the electrical connectors 208 are exposed, and are level with a surface of the molding material 210. The electrical connectors 208 may be referred to as through molding vias (TMVs), through package vias (TPVs), and/or through integrated fan-out (InFO) vias (TIVs) and will be referred to as TIVs 208 hereinafter.

Figure 19:
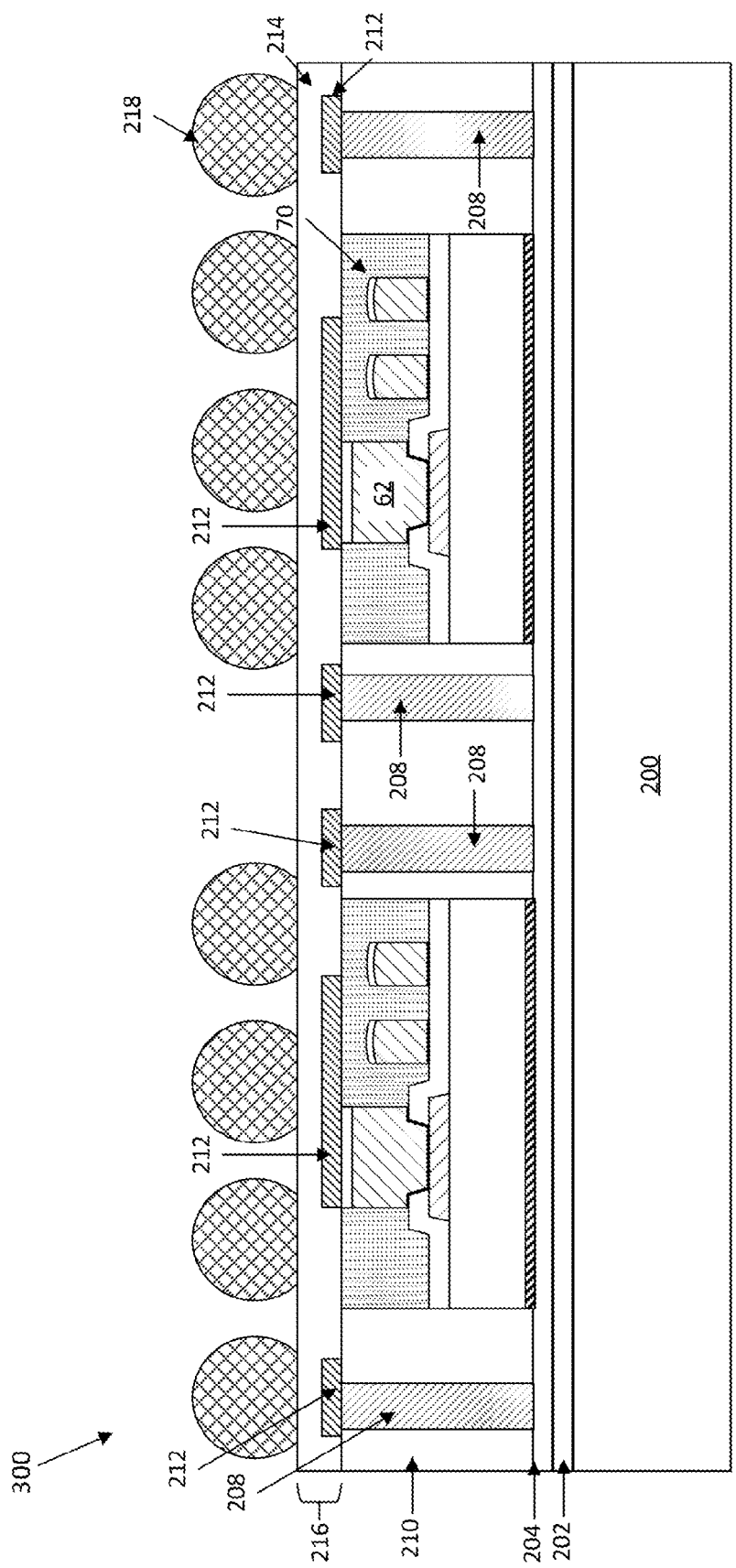

FIG. 19 illustrates forming a redistribution layer 216 and conductive connectors 218 over the dies 100, the TIVs 208, and the molding material 210. The redistribution layer 216 may include one or more metal layers, sometimes referred to as $M_1$ and/or $M_N$, where the metal layer $M_1$ is the metal layer immediately adjacent the dies 100 and metal layer $M_N$ (sometimes referred to as the top metal layer $M_N$) is the metal layer furthest from the dies 100. Throughout the description, the term "metal layer" refers to the collection of metal lines 212 in the same layer. The redistribution layer 216 may include one or more passivation layers 214, wherein the one or more metal layers ($M_1$ through $M_N$) are disposed in the one or more passivation layers 214.

The passivation layers 214 can be silicon nitride, silicon carbide, silicon oxide, low-k dielectrics such as carbon doped oxides, extremely low-k dielectrics such as porous carbon doped silicon dioxide, a polymer, such as an epoxy, polyimide, BCB, PBO, solder resist (SR), the like, or a combination thereof, although other relatively soft, often organic, dielectric materials can also be used, and deposited by CVD, PVD, ALD, a spin-on-dielectric process, a lamination process, the like, or a combination thereof. The passivation layers 214 may undergo a curing step to cure the passivation layers 214, wherein the curing may be a thermal curing, a UV curing, the like, or a combination thereof.

The metal layers 212 may be formed using a single and/or a dual damascene process, a via-first process, or a metal-first process. The metal layers and vias 212 may be formed of a conductive material, such as copper, aluminum, titanium, the like, or a combination thereof, with or without a barrier layer.

In an exemplary embodiment, the metal layers 212 are formed using a dual damascene process. In this example, the formation of the $M_1$ layer may begin with the formation of an etch stop layer (not shown) on the lowermost passivation layer 214 and with the next passivation layer 214 on the etch stop layer. Once the next passivation layer 214 is deposited, portions of the next passivation layer 214 may be etched away to form recessed features, such as trenches and vias, which can be filled with conductive material to connect different regions of the redistribution layer 216 and accommodate the metal lines 212 and vias. This process may be repeated for the remaining metal layers through $M_N$.

Figure 23:
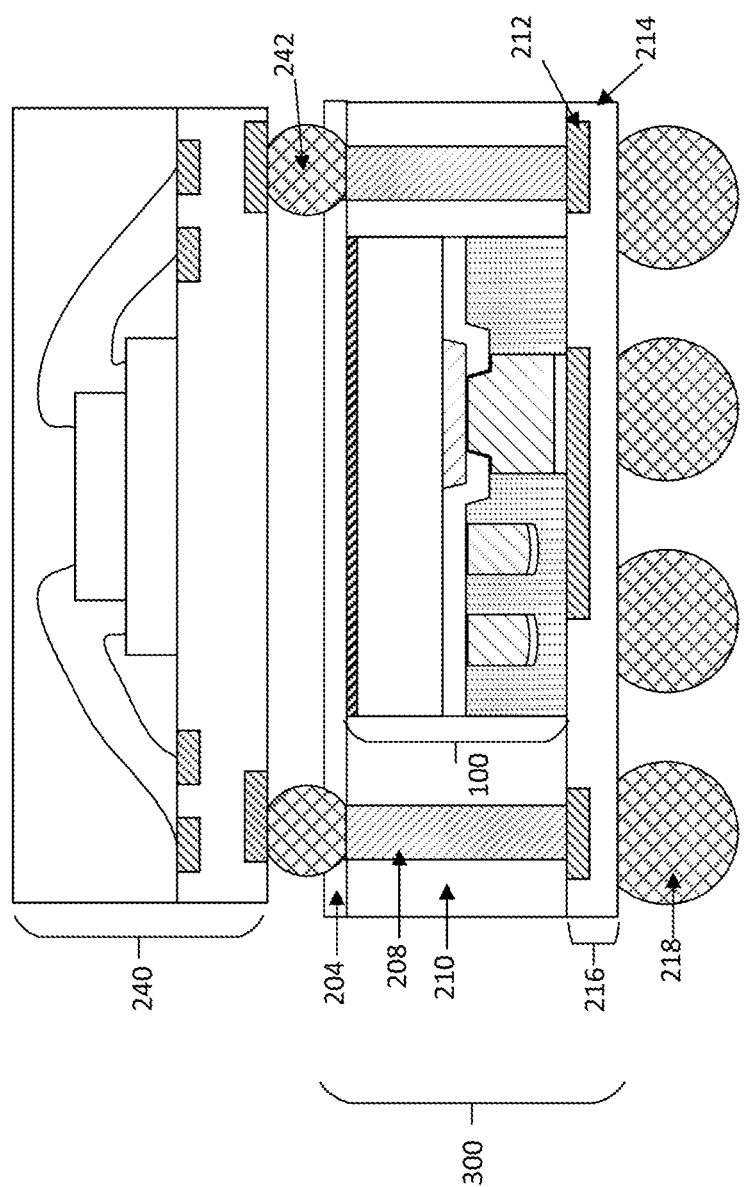
Figure 24:
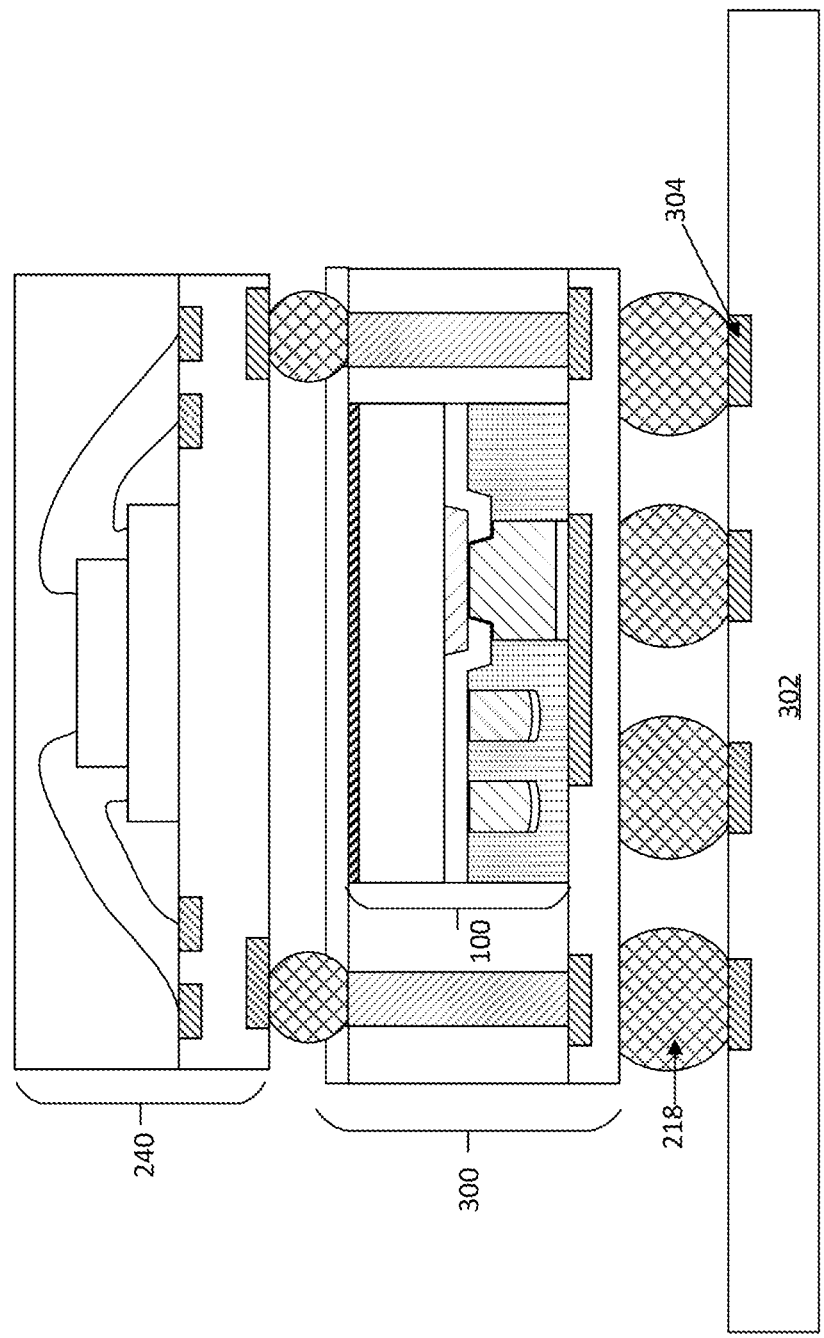

The redistribution layer 216 may be referred to as a front-side redistribution layer for the first package 300 (see FIGS. 23 and 24). This front-side redistribution layer 216 may be utilized to couple the first package 300 via the connectors 218 to one or more packages, package substrates, components, the like, or a combination thereof (see FIG. 24).

The number of metal layers 212 and the number of passivation layers 214 are only for illustrative purposes and are not limiting. There could be other number of layers that is more or less than the one metal layer illustrated. There may be other number of passivation layers, and other number of metal layers different from those illustrated in FIG. 19.

FIG. 19 further illustrates the formation of a set of conductive connectors 218 over and electrically coupled to the redistribution layer 216. The conductive connectors 218 may be solder bumps, metal pillars, controlled collapse chip connection (C4) bumps, micro bumps, electroless nickel-electroless palladium-immersion gold technique (ENEPIG) formed bumps, or the like. The conductive connectors 218 may include a conductive material such as solder, copper, aluminum, gold, nickel, silver, palladium, tin, the like, or a combination thereof. In an embodiment in which the conductive connectors 218 are solder bumps, the conductive connectors 218 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 218 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 218. The metal cap layer may include nickel, tin, tin-lead, gold, silver, palladium, indium, nickel-palladium-gold, nickel-gold, the like, or a combination thereof and may be formed by a plating process.

Although not shown, there may be UBMs coupled to the redistribution layer 216 with the conductive connectors 218 coupled to the UBMs (not shown). The UBMs may be formed by first forming a set of openings (not shown) may be formed through the topmost passivation layer 214 to expose surfaces of the metal lines 212 in the metal layer $M_N$. The UBMs may extend through these openings in the passivation layer 214 and also extend along a surface of passivation layer 214. The UBMs may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs are fully intended to be included within the scope of the current application.

Figure 20A:
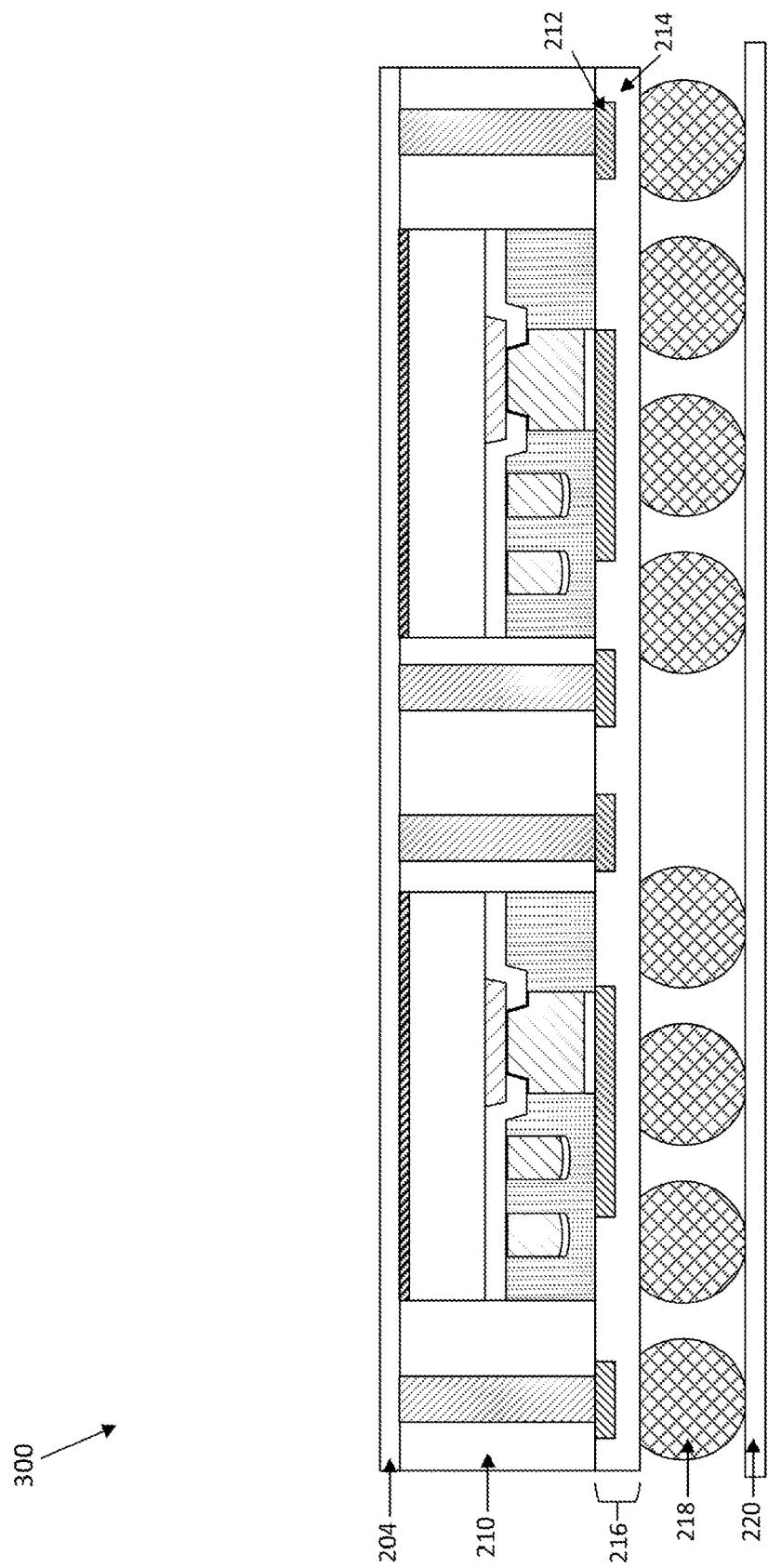

FIG. 20A illustrates removing the carrier substrate 200 and the adhesive layer 202 to expose the dielectric layer 204 according to an embodiment. In this embodiment, the first package(s) 300 are placed on a frame 220 with the conductive connectors 218 adjoining the frame 220 while the carrier substrate 200 and the adhesive layer 202 are removed.

Figure 20B:
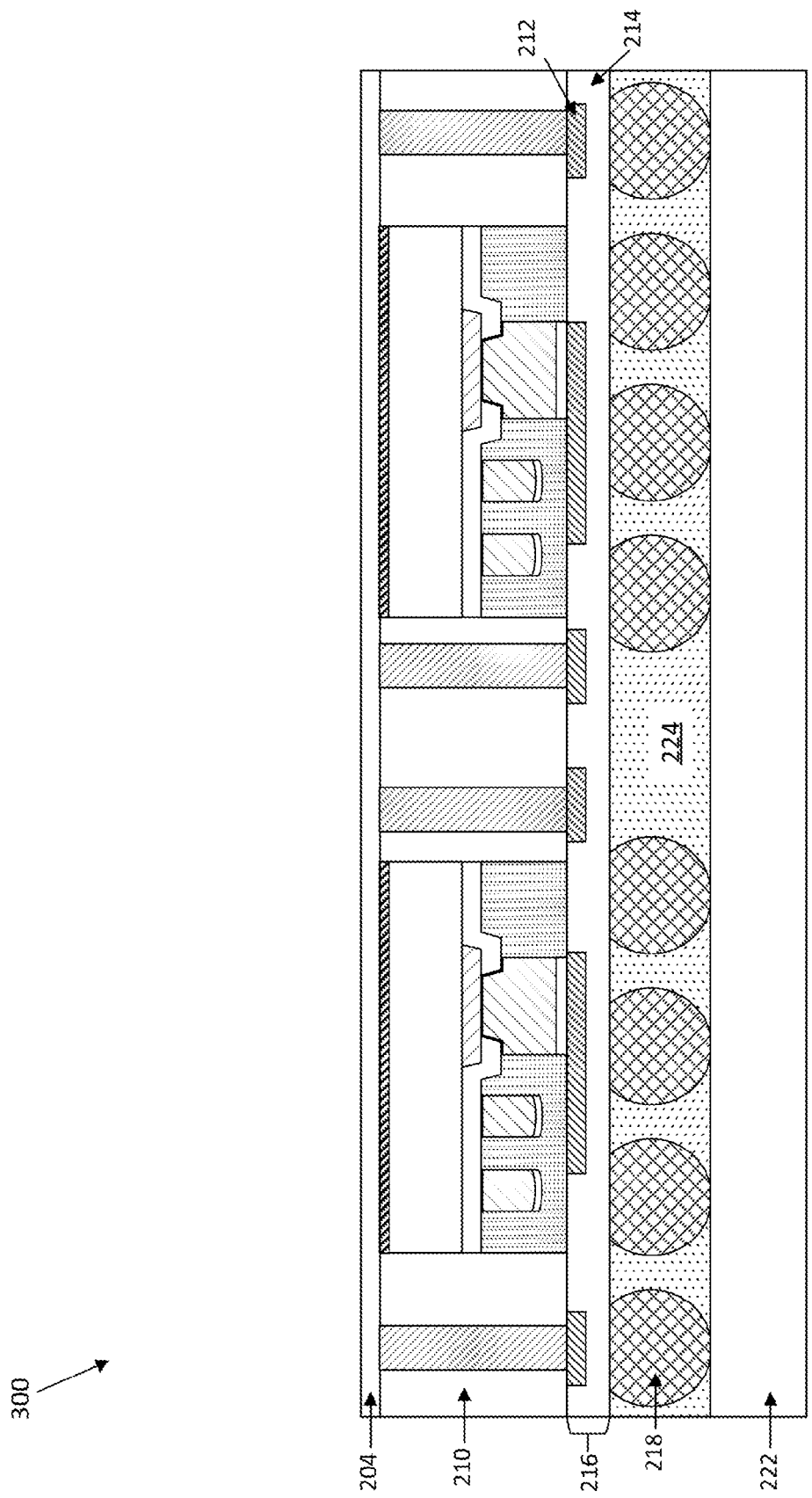

FIG. 20B illustrates removing the carrier substrate 200 and the adhesive layer 202 to expose the dielectric layer 204 according to another embodiment. In this embodiment, the first package(s) 300 are placed on a second carrier substrate 222 with the conductive connectors 218 adjoining the second carrier substrate 222 while the carrier substrate 200 and the adhesive layer 202 are removed. This embodiment may include a peelable glue 224 on the second carrier substrate 222 with the conductive connectors 218 being embedded in the peelable glue 224. The peelable glue 224 may help to secure the first package(s) 300 to the second carrier substrate 222. After the carrier substrate 200 is removed, the peelable glue 224 may be removed by a peel-off method that includes a thermal process, a chemical strip process, laser removal, a UV treatment, the like, or a combination thereof.

Figure 21:
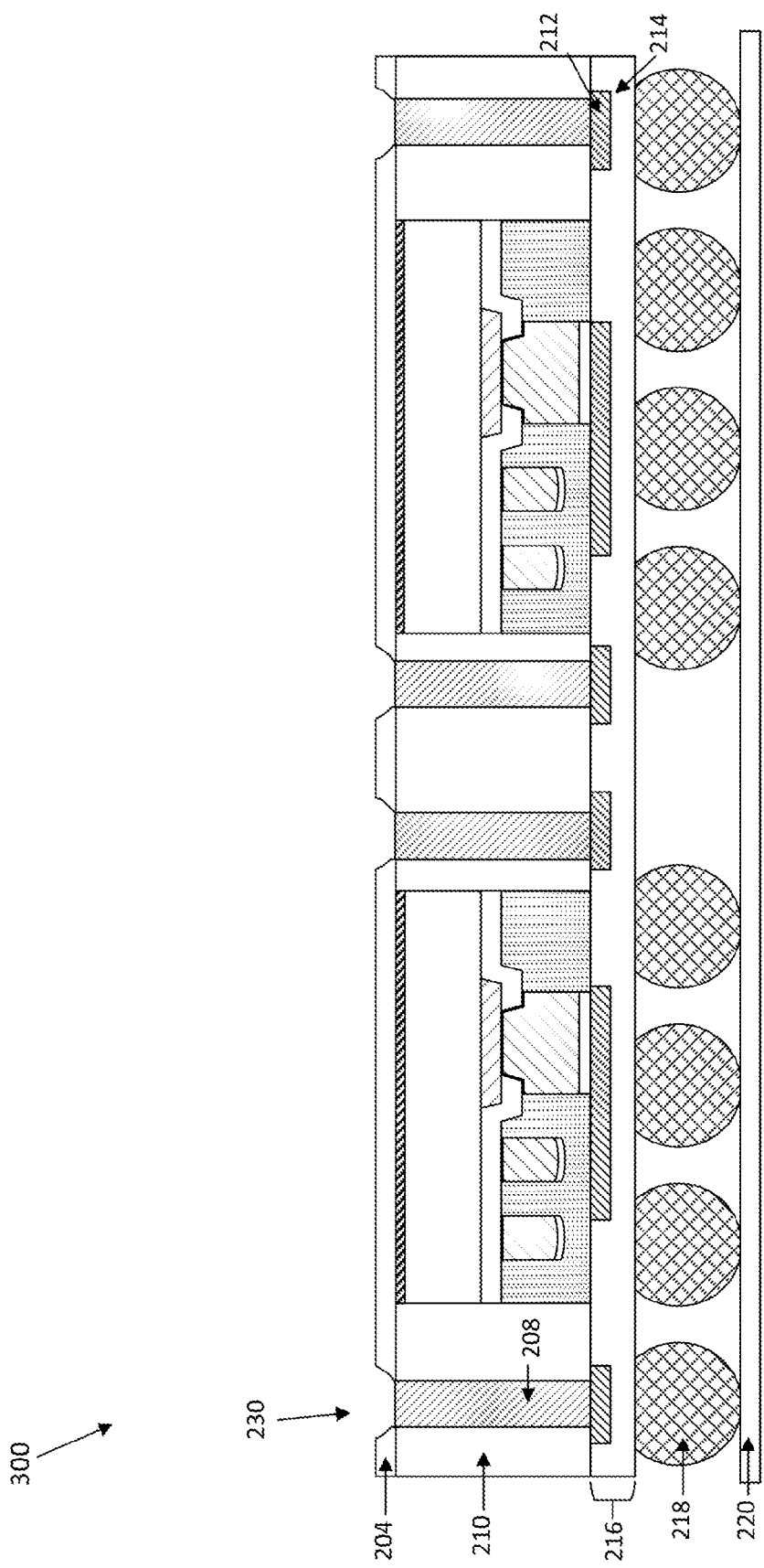

In FIG. 21, openings are formed through at least a portion of the dielectric layer 204 to expose portions of the conductive features in backside redistribution structure 204 and/or the TIVs 208. The openings may be formed, for example, using laser drilling, etching, or the like.

Figure 22:
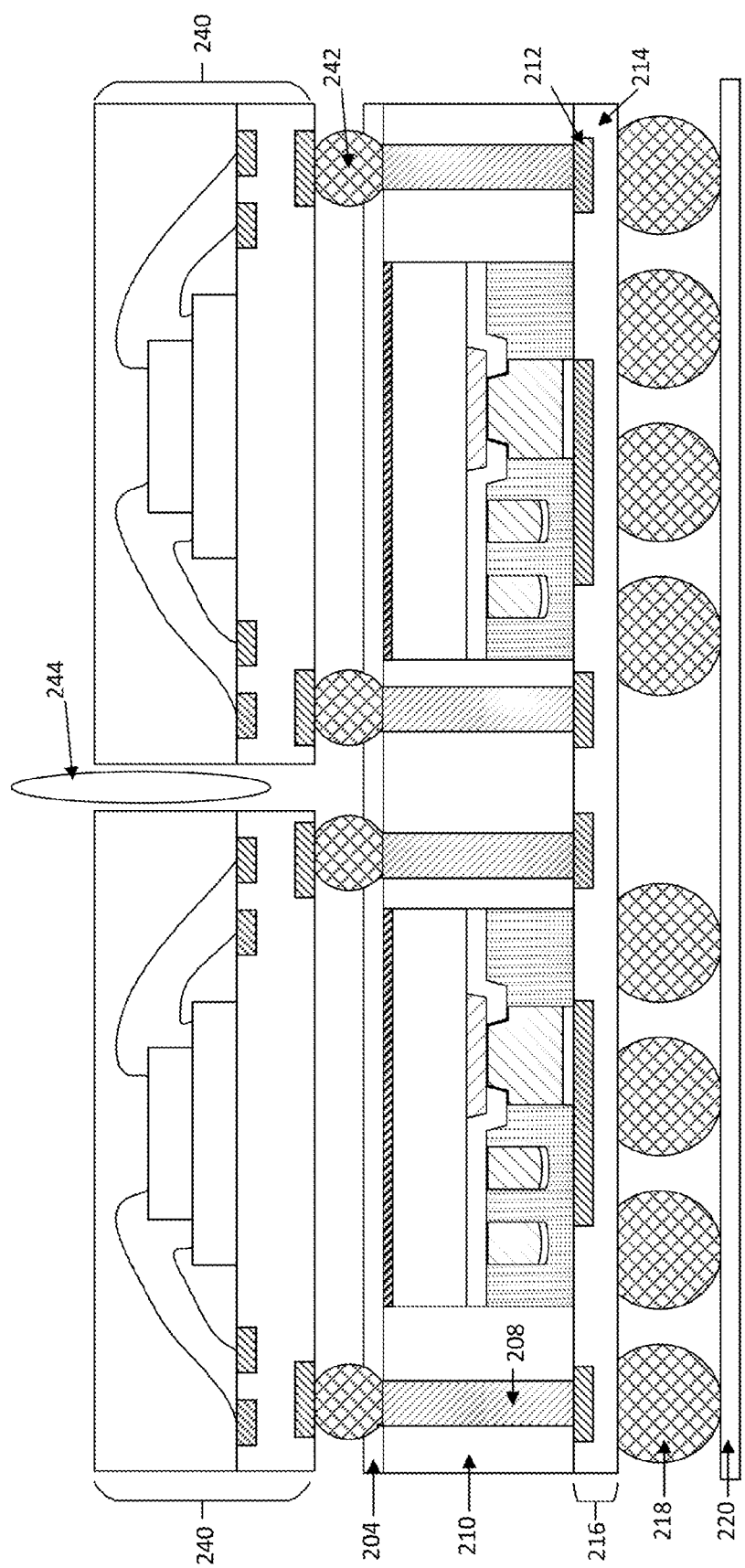

In FIG. 22, packages 240 are attached to the back side redistribution structure 204 and/or TIVs 208 using conductive connectors 242. The packages 240 can be and/or include any package component. For example, as illustrated, the packages 240 each include a substrate, two stacked integrated circuit dies on the substrate, wire bonds electrically coupling the integrated circuit dies to the substrate, and an encapsulant encapsulating the stacked integrated circuit dies and the wire bonds. In an example, the integrated circuit dies of the packages 240 are memory dies, such as dynamic random access memory (DRAM) dies. The packages 240 are electrically and mechanically coupled to the back side redistribution structure 204 and/or TIVs 208 by conductive connectors 242. In some embodiments, the conductive connectors 242 may be solder bumps, metal pillars, C4 bumps, micro bumps, ENEPIG formed bumps, or the like. In some embodiments, the conductive connectors 242 can be reflowed to attach the packages 240 to first package(s) 300. The integrated circuit dies of the packages 240 are electrically and communicatively coupled to the integrated circuit dies 100 through, for example, the wire bonds and substrate in the packages 240, the conductive connectors 242, the back side redistribution structure 204, the TIVs 208, and the front-side redistribution structure 216.

Further in FIG. 22, a singulation process is performed by sawing 244 along a scribe line region between the packages 240. The sawing 184 singulates the first packages 300 into separate first packages 300. FIG. 23 illustrates a resulting, singulated package-on-package (PoP) structure. The singulation results in a first package 300, which may be from one of the first package(s) 300 in FIG. 22, being singulated. As illustrated, the package 240 is attached to the back side redistribution structure 204 of the first package(s) 300.

In FIG. 24, the PoP structure is attached to a substrate 302. The external conductive connectors 218 are electrically and mechanically coupled to pads 304 on the substrate 302. The substrate 302 can be, for example, a printed circuit board (PCB) or the like.

By controlling the plating process to have different plating rates for different conductive feature sizes, a height differentiation for conductive features that are formed in the same plating step can be achieved. This feature height differentiation allows for the larger conductive features to, for example, act as vias to the next level of the interconnect structure, while the smaller features can be conductive lines/structures within the current interconnect level. Because the conductive vias and the conductive lines are both formed in the same process at the same time, there number of patterning steps and passivation/dielectric layers are reduced. This reduction in patterning steps and passivation/dielectric layers can further cause a reduction in the stress and warpage on the die because many passivation/dielectric layers require curing steps, which can cause stress and warpage on the die. Further, because of the metal cap layer over the conductive via, the end of the test probe contact can be flat (as opposed to a pointed end) which minimizes the damage to the conductive via and/or metal cap layer. Moreover, the flat ended test probe contact and the conductive via with the metal cap allow for the testing rate (e.g. wafers per hour) to be increased by about 7-8 times as compared to a pointed probe contact being used on an aluminum pad.

An embodiment is a device including a pad on a substrate. A passivation film is on the substrate and covering at least a portion of the pad. A first conductive feature is on the pad and has a planar top surface, with the first conductive feature having a first height as measured from the pad to the planar top surface of the first conductive feature. A second conductive feature is on the passivation film and has a non-planar top surface, with the second conductive feature having a second height as measured from the passivation film to the non-planar top surface of the second conductive feature.

Another embodiment is a device including a pad on a semiconductor substrate and a conformal passivation film on the substrate and covering at least a portion of the pad. A conductive via is on the pad and has a first height as measured from the pad to a top surface of the conductive via. A conductive line is on the conformal passivation film and has a second height as measured from the conformal passivation film to a top surface of the conductive line, the first height being greater than the second height. A dielectric material is over the conformal passivation film and has a top surface coplanar with the top surface of the conductive via, the dielectric material encapsulating the conductive line.

A further embodiment is a method including performing a first formation process to form a first conductive feature of a first height and a second conductive feature of a second height over a substrate. The first height is measured from a bottom surface of the first conductive feature to a top surface of the first conductive feature and the second height is measured from a bottom surface of the first conductive feature to a top surface of the first conductive feature. The first height is larger than the second height. The method further includes encapsulating sidewalls of the first conductive feature and the top surface and sidewalls of the second conductive feature with a dielectric material, the top surface of the first conductive feature being coplanar with a top surface of the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   performing a formation process for a first amount of time to form a first conductive feature of a first height and a second conductive feature of a second height over a substrate, the first height being measured from a first surface of the first conductive feature to a second surface of the first conductive feature, the second height being measured from a first surface of the second conductive feature to a second surface of the second conductive feature, the first height being larger than the second height, wherein at an end of the first amount of time, the first conductive feature is at the first height and the second conductive feature is at the second height, wherein the first surface of the first conductive feature and the first surface of the second conductive feature are planar with each other, wherein the first surface of the first conductive feature is a surface of the first conductive feature that is closest to the substrate, wherein the first surface of the second conductive feature is a surface of the second conductive feature that is closest to the substrate, and wherein the first conductive feature and the second conductive feature are simultaneously formed in the formation process;

forming a first cap layer over the first conductive feature and a second cap layer over the second conductive feature;

encapsulating sidewalls of the first conductive feature and the second surface and sidewalls of the second conductive feature with a dielectric material; and performing a planarization process to planarize a surface of the dielectric material, wherein the planarization process removes a portion of the first cap layer that extends along the second surface of the first conductive feature.

2. The method of claim 1, wherein the first conductive feature has a larger diameter than the second conductive feature, the diameters of the first and second conductive features being measured in a plane parallel to a major surface of the substrate.

3. The method of claim 1, wherein performing the formation process comprises performing an electroplating process over the substrate for the first amount of time.

4. The method of claim 1, further comprising:
forming a third conductive feature over the dielectric material and the first conductive feature, the third conductive feature contacting the first conductive feature or the first cap layer; and
forming a fourth conductive feature over a top surface of the dielectric material at a same level as the third conductive feature, at least a portion of the fourth conductive feature overlapping the second conductive feature, the fourth conductive feature being electrically isolated from the second conductive feature.

5. The method of claim 4, further comprising forming another dielectric material over the dielectric material that encapsulates the sidewalls of the first conductive feature and the second surface and sidewalls of the second conductive feature.

6. The method of claim 1, wherein a top surface of the second cap layer is recessed from a top surface of the dielectric material.

7. The method of claim 1, further comprising forming a passivation layer over the substrate, the passivation layer disposed between the substrate and the second conductive feature.

8. The method of claim 1, wherein the second conductive feature has a non-planar second surface.

9. A method, comprising:
forming a pad on a substrate;
forming a passivation layer over the substrate and patterning the passivation layer to expose the pad;
forming a seed layer over the passivation layer;
performing an electroplating process to form a first conductive feature of a first height and a second conductive feature of a second height over the substrate, the first height being measured from a bottom surface of the first conductive feature that contacts the pad to a top surface of the first conductive feature, the second height being measured from a bottom surface of the second conductive feature that contacts the passivation layer to a top surface of the second conductive feature, the first height being larger than the second height, and the top surface of the first conductive feature being farther from the substrate than the top surface of the second conductive feature;
forming a first cap layer over the first conductive feature and a second cap layer over the second conductive feature, wherein the first cap layer contacts the passivation layer;
encapsulating sidewalls of the first conductive feature and the top surface and sidewalls of the second conductive feature with a first dielectric material; and
planarizing a top surface of the first dielectric material, wherein the planarization removes a portion of the first cap layer that extends along the top surface of the first conductive feature.

10. The method of claim 9, further comprising:
forming a third conductive feature over the first dielectric material and the first conductive feature, the third conductive feature contacting the first conductive feature.

11. The method of claim 9, wherein the electroplating process is performed for a first amount of time, wherein at an end of the first amount of time, the first conductive feature is at the first height and the second conductive feature is at the second height.

12. The method of claim 9, wherein the first conductive feature has a larger diameter than the second conductive feature, the diameters of the first and second conductive features being measured in a plane parallel to a major surface of the substrate.

13. The method of claim 9, wherein the second conductive feature has a non-planar top surface and the first conductive feature has a non-planar top surface.

14. A method, comprising:
forming a pad on a substrate;
forming a passivation layer over the substrate, the passivation layer partially covering the pad;
depositing a seed layer over the passivation layer;
performing an electroplating process to form a first conductive via over the pad and a first conductive line over the passivation layer, a height of the first conductive via being larger than a height of the first conductive line, wherein the first conductive via has a same diameter at a surface of the first conductive via that contacts the passivation layer and at a second position of the first conductive via, the second position being between the surface of the first conductive via that contacts the passivation layer and a surface of the first conductive via that is farthest from the substrate, the second position being farther from the substrate than a surface of the first conductive line that is farthest from the substrate, wherein the first conductive via and the first conductive line are formed at least in part at a same time;

forming a first cap layer on a top surface of the first conductive line and along sidewalls of the first conductive line, wherein the first cap layer contacts the passivation layer;

forming a second cap layer along sidewalls of the first conductive via and on the surface of the first conductive via that is farthest from the substrate;

encapsulating the sidewalls of the first conductive via and the sidewalls of the first conductive line with a dielectric material, a first portion of the dielectric material overlying the first conductive via; and performing a planarization process to remove the first portion of the dielectric material, wherein after removing the first portion of the dielectric material, dielectric material extends along the surface of the first conductive line that is farthest from the substrate, and the planarization process removes a portion of the second cap layer that extends along the surface of the first conductive via that is farthest from the substrate.

15. The method of claim 14, wherein the first cap layer and the second cap layer are formed using another electroplating process.

16. The method of claim 14, wherein the electroplating process is performed for a first amount of time, wherein at an end of the first amount of time, the height of the first conductive via is larger than the height of the first conductive line.

17. The method of claim 14, further comprising:
forming a second conductive via over the dielectric material and the first conductive via, the second conductive via contacting the first conductive via; and forming second conductive line over the dielectric material at a same level as the second conductive via, at least a portion of the second conductive line overlapping the first conductive line, the second conductive line being electrically isolated from the first conductive line.

18. The method of claim 1, wherein forming the first cap layer and the second cap layer comprises performing an electroplating process.

19. The method according to claim 10, wherein the third conductive feature is disposed in a second dielectric material, and a plurality of external connectors are disposed on and contact the second dielectric material.

20. The method according to claim 19, wherein a molding material extends along sidewalls of the first dielectric material, and a through via extends through the molding material along a sidewall of the substrate.

* * * * *